(12) United States Patent
Manipatruni et al.

(10) Patent No.: US 11,139,270 B2
(45) Date of Patent: Oct. 5, 2021

(54) ARTIFICIAL INTELLIGENCE PROCESSOR WITH THREE-DIMENSIONAL STACKED MEMORY

(71) Applicant: Kepler Computing Inc., San Francisco, CA (US)

(72) Inventors: Sasikanth Manipatruni, Portland, OR (US); Rajeev Kumar Dokania, Beaverton, OR (US); Amrita Mathuriya, Portland, OR (US); Ramamoorthy Ramesh, Moraga, CA (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 16/357,265

(22) Filed: Mar. 18, 2019

(65) Prior Publication Data
US 2020/0303343 A1  Sep. 24, 2020

(51) Int. Cl.
*H01L 25/065* (2006.01)
*H01L 23/525* (2006.01)
(Continued)

(52) U.S. Cl.
CPC ........ *H01L 25/0657* (2013.01); *G06F 9/5077* (2013.01); *G11C 7/1006* (2013.01);
(Continued)

(58) Field of Classification Search
CPC ... H01L 25/0657; H01L 23/525; H01L 24/73; G06F 9/5077
See application file for complete search history.

(56) References Cited

U.S. PATENT DOCUMENTS

| 5,834,162 A | 11/1998 | Malba |
| 6,890,798 B2 | 5/2005 | McMahon |

(Continued)

FOREIGN PATENT DOCUMENTS

| KR | 1020100081272 | 7/2010 |
| TW | 201327740 | 1/2013 |
| TW | 201430968 | 8/2014 |

OTHER PUBLICATIONS

Restriction Requirement notified Jan. 2, 2020 for U.S. Appl. No. 16/357,272.
(Continued)

*Primary Examiner* — Christine A Enad
(74) *Attorney, Agent, or Firm* — Mughal IP P.C.

(57) ABSTRACT

Described is a packaging technology to improve performance of an AI processing system. An IC package is provided which comprises: a substrate; a first die on the substrate, and a second die stacked over the first die. The first die includes memory and the second die includes computational logic. The first die comprises a ferroelectric RAM (FeRAM) having bit-cells. Each bit-cell comprises an access transistor and a capacitor including ferroelectric material. The access transistor is coupled to the ferroelectric material. The FeRAM can be FeDRAM or FeSRAM. The memory of the first die may store input data and weight factors. The computational logic of the second die is coupled to the memory of the first die. The second die is an inference die that applies fixed weights for a trained model to an input data to generate an output. In one example, the second die is a training die that enables learning of the weights.

22 Claims, 18 Drawing Sheets

(51) Int. Cl.
  *H01L 23/00* (2006.01)
  *G06F 9/50* (2006.01)
  *G11C 7/10* (2006.01)
  *G11C 11/419* (2006.01)
  *H01L 27/11* (2006.01)

(52) U.S. Cl.
  CPC .......... *G11C 11/419* (2013.01); *H01L 23/525* (2013.01); *H01L 24/73* (2013.01); *H01L 27/11* (2013.01); *H01L 2224/32145* (2013.01)

(56) References Cited

U.S. PATENT DOCUMENTS

| | | |
|---|---|---|
| 7,217,596 B2 | 5/2007 | Cobbley et al. |
| 7,683,459 B2 | 3/2010 | Ma et al. |
| 8,143,710 B2 | 3/2012 | Cho |
| 8,198,716 B2 | 6/2012 | Periaman et al. |
| 8,525,342 B2 | 9/2013 | Chandrasekaran et al. |
| 8,546,955 B1 | 10/2013 | Wu |
| 8,612,809 B2 | 12/2013 | Casper et al. |
| 8,759,899 B1 | 6/2014 | Lue et al. |
| 9,165,968 B2 | 10/2015 | Chao et al. |
| 9,379,078 B2 | 6/2016 | Yu et al. |
| 9,627,365 B1 | 4/2017 | Yu et al. |
| 9,748,190 B2 | 8/2017 | Chen et al. |
| 2007/0208902 A1 | 9/2007 | Park et al. |
| 2010/0008058 A1 | 1/2010 | Saen et al. |
| 2010/0167467 A1 | 7/2010 | Aoi |
| 2012/0106117 A1 | 5/2012 | Sundaram et al. |
| 2013/0320560 A1 | 12/2013 | Seeker et al. |
| 2014/0208041 A1* | 7/2014 | Hyde ............... G06F 13/16 711/146 |
| 2014/0217616 A1 | 8/2014 | Choi |
| 2014/0371109 A1 | 12/2014 | McMillen et al. |
| 2015/0091131 A1 | 4/2015 | Lamorey et al. |
| 2016/0126291 A1 | 5/2016 | Lu et al. |
| 2016/0357630 A1 | 12/2016 | Kang et al. |
| 2017/0018301 A1 | 1/2017 | Kilmer et al. |
| 2017/0077387 A1 | 3/2017 | Kan et al. |
| 2017/0084312 A1* | 3/2017 | Kim ............... G11C 5/147 |
| 2017/0084596 A1 | 3/2017 | Scanlan |
| 2018/0082981 A1* | 3/2018 | Gowda ............... H01L 23/5385 |
| 2018/0107630 A1 | 4/2018 | Zhou et al. |
| 2018/0254073 A1 | 9/2018 | Frans |
| 2018/0330236 A1 | 11/2018 | Hou |
| 2019/0042251 A1 | 2/2019 | Nurvitadhi et al. |
| 2019/0050040 A1 | 2/2019 | Baskaran et al. |
| 2019/0051642 A1* | 2/2019 | Gupta Hyde ........... G06F 1/324 |
| 2019/0065956 A1 | 2/2019 | Qian et al. |
| 2019/0096453 A1* | 3/2019 | Shin ............... G11C 7/1078 |
| 2019/0114535 A1* | 4/2019 | Ng ............... G06N 3/0454 |
| 2019/0198083 A1 | 6/2019 | Biswas et al. |
| 2019/0205244 A1* | 7/2019 | Smith ............... G06F 12/12 |
| 2019/0220434 A1 | 7/2019 | Dai et al. |
| 2019/0229101 A1 | 7/2019 | Lee |
| 2019/0259732 A1* | 8/2019 | Choo ............... G06F 3/0659 |
| 2019/0267074 A1 | 8/2019 | Fishburn et al. |
| 2019/0279697 A1 | 9/2019 | Karpov et al. |
| 2019/0318975 A1 | 10/2019 | Shi et al. |
| 2020/0098725 A1* | 3/2020 | Liff ............... H01L 24/16 |
| 2020/0126995 A1 | 4/2020 | Ge et al. |
| 2020/0161230 A1 | 5/2020 | Knickerbocker et al. |
| 2020/0168550 A1 | 5/2020 | Ryu et al. |
| 2020/0168554 A1 | 5/2020 | Fay et al. |

OTHER PUBLICATIONS

Jun, H. et al., "HBM (High Bandwidth Memory) DRAM Technology and Architecture", 2017 IEEE International Memory workshop (IMW), Monterey, CA, 2017, pp. 1-4.

Kim, J. et al., "A 1.2 V 12.8 GB/s 2 GB Mobile Wide-I/O DRAM With 4$\times$128 I/Os Using TSV Based Stacking", IEEE Journal of Solid-State Circuits, vol. 47, No. 1, pp. 107-116, Jan. 2012.

Lee, D. et al., "A 1.2V 8Gb 8-channel 128GB/S high-bandwidth memory (HBM) stacked DRAM with effective microbump I/O test methods using 29nm process and TSV", 2014 IEEE International Solid-State Circuits Conference Digest of Technical Papers (ISSCC), San Francisco, CA, 2014, pp. 432-433.

Macri, J. "AMD's next generation GPU and high bandwidth memory architecture: FURY", 2015 IEEE Hot Chips 27 Symposium (HCS), Cupertino, CA, 2015, pp. 1-26.

Yu, D. "Wafer level system integration for SiP", 2014 IEEE International Electron Devices Meeting, San Francisco, CA, 2014, p. 27.1.1-27.1.4.

Pugsley et al., "NDC: Analyzing the impact of 3D-stacked memory+ logic devices on MapReduce workloads", 2014 IEEE International Symposium on Performance Analysis of Systems and Software (ISPASS), Monterey, CA, 2014, pp. 190-200.

Shulaker et al., "Monolithic 3D integration of logic and memory Carbon nanotube FETs, resistive RAM, and silicon FETs", 2014 IEEE International Electron Devices Meeting, San Francisco, CA, 2014, pp. 27.4.1-27.4.4.

Sun et al., "A novel architecture of the 3D stacked MRAM L2 cache for CMPs", 2009 IEEE 15th International Symposium on High Performance Computer Architecture, Raleigh, NC, 2009, pp. 239-249.

Woo et al., "An optimized 3D-stacked memory architecture by exploiting excessive, high-density TSV bandwidth", HPCA-16 2010 The Sixteenth International Symposium on High-Performance Computer Architecture, Bangalore, 2010, pp. 1-12.

Restriction Requirement dated Apr. 3, 2020 for U.S. Appl. No. 16/428,885.

Restriction Requirement dated Apr. 3, 2020 for U.S. Appl. No. 16/428,893.

International Search Report & Written Opinion notified Jun. 11, 2020 for PCT Patent Application No. PCT/US2020/018875.

International Search Report & Written Opinion notified Sep. 1, 2020 for PCT Patent Application No. PCT/US2020/032974.

Non-Final Office Action notified Jul. 20, 2020 for U.S. Appl. No. 16/357,272.

Non-Final Office Action notified Sep. 3, 2020 for U.S. Appl. No. 16/428,885.

Non-Final Office Action notified Sep. 3, 2020 for U.S. Appl. No. 16/428,893.

Advisory Action notified Mar. 3, 2021 for U.S. Appl. No. 16/357,272.

Final Office Action notified Dec. 31, 2020 for U.S. Appl. No. 16/357,272.

Notice of Allowance notified Feb. 22, 2020 for U.S. Appl. No. 16/428,885.

1st Office Action & Search Report notified Dec. 9, 2020, for Taiwan Patent Application No. 109106755.

Non-Final Office Action notified Mar. 22, 2021 for U.S. Appl. No. 16/357,265.

Decision of Rejection notified May 18, 2021 for Taiwan Patent Application No. 109106755.

\* cited by examiner

ARTIFICIAL INTELLIGENCE PROCESSOR WITH THREE-DIMENSIONAL STACKED MEMORY

BACKGROUND

Artificial intelligence (AI) is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained". This trained model with fixed weights is then used to make decisions about new data. Training a model and then applying the trained model for new data is hardware intensive activity. There is a desire to reduce latency of computing the training model and using the training model, and to reduce the power consumption of such AI processor systems.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 10 illustrates a method of forming a package with

DETAILED DESCRIPTION

Figure 1:
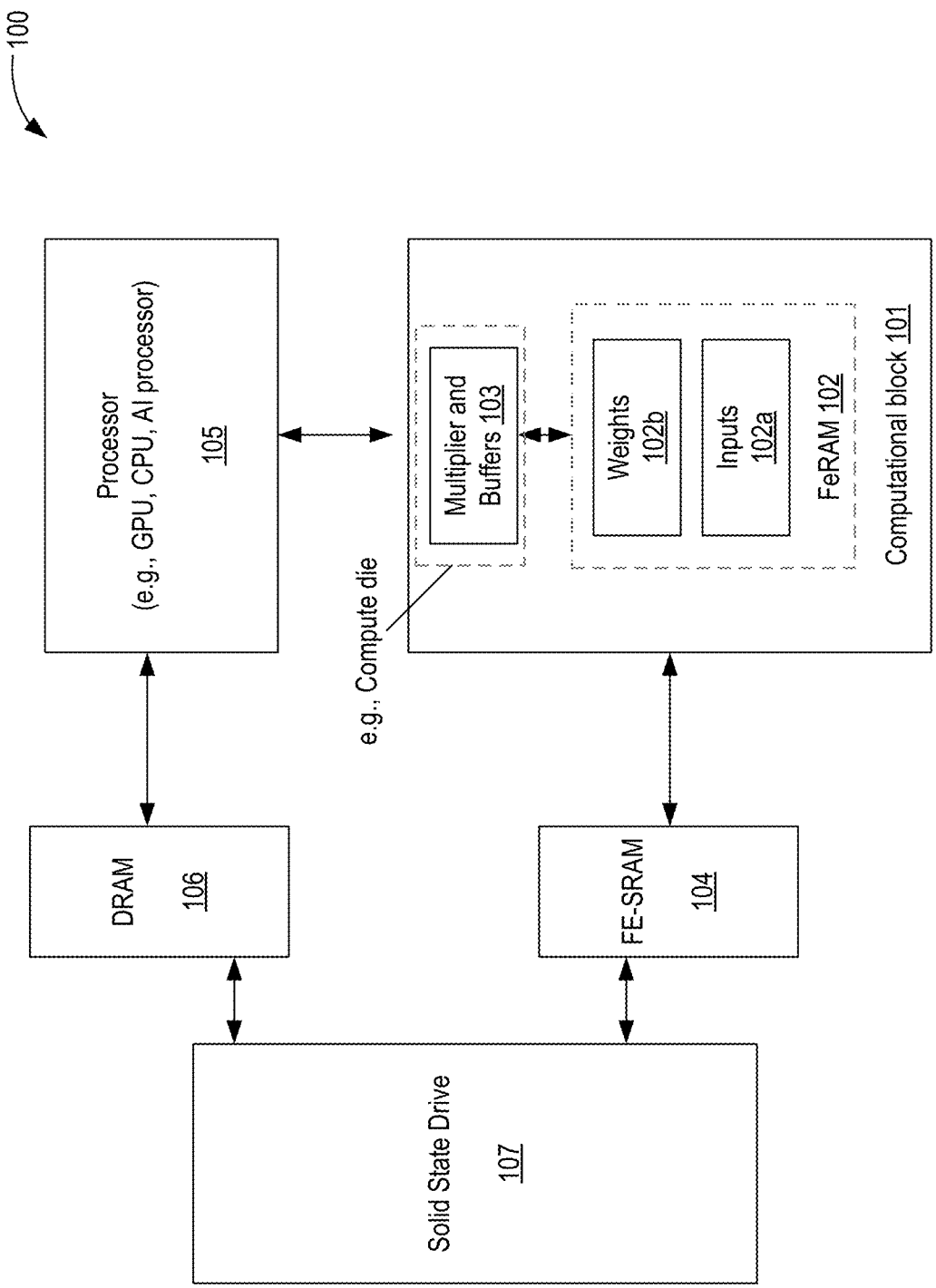
FIG. 1 illustrates a high-level architecture of an artificial intelligence (AI) machine comprising a compute die positioned on top of a memory die, in accordance with some embodiments.

Some embodiments describe a packaging technology to improve performance of an AI processing system. In some embodiments, an integrated circuit package is provided which comprises: a substrate; a first die on the substrate, and a second die stacked over the first die, wherein the first die comprises memory and the second die comprises computational logic. In some embodiments, the first die comprises a ferroelectric random access memory (FeRAM) having bit-cells, wherein each bit-cell comprises an access transistor and a capacitor including ferroelectric material, and wherein the access transistor is coupled to the ferroelectric material. The FeRAM can be FeDRAM (ferroelectric dynamic random access memory) or FeSRAM (ferroelectric static random access memory). The memory of the first die may store input data and weight factors. The computational logic of the second die is coupled to the memory of the first die. The second die can be an inference die that applies fixed weights for a trained model to an input data to generate an output. In some embodiments, the second die includes processing cores (or processing entities (PEs)) that have matrix multipliers, adders, buffers, etc. In some embodiments, first die comprises a high bandwidth memory (HBM). HBM may include a controller and memory arrays.

In some embodiments, the second die includes an application specific integrated circuit (ASIC) which can train the model by modifying the weights and also use the model on new data with fixed weights. In some embodiments, the memory comprises an SRAM (static random access memory). In some embodiments, the memory of the first die comprises MRAM (magnetic random access memory).). In some embodiments, the memory of the first die comprises Re-RAM (resistive random access memory). In some embodiments, the substrate is an active interposer, and the first die is embedded in the active interposer. In some embodiments, the first die is an active interposer itself.

In some embodiments, the integrated circuit package is a package for a system-on-chip (SOC). The SOC may include a compute die on top of a memory die; an HBM, and a processor die coupled to memory dies adjacent to it (e.g., on top of or on the side of the processor die). In some embodiments, the SOC include a solid-state memory die.

There are many technical effects of the packaging technology of various embodiments. For example, by placing the memory die below the compute die, or by placing one or more memory dies on the side(s) of the compute die, AI system performance improves. In some embodiments, by using Fe-RAMs for the memory, matrix multiplication process by the compute die is 15 to 20 times faster than traditional matrix multiplication. Further, using Fe-RAM reduces power consumption of the AI system by orders of magnitude compared to SRAM based memory. Using Fe-RAM also lowers the interconnect energy, lowers the external memory bandwidth requirement, and reduces circuit complexity, and lowers the cost of the compute system. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top." "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1 illustrates a high-level architecture of an artificial intelligence (AI) machine 100 comprising a compute die positioned on top of a memory die, in accordance with some embodiments. AI machine 100 comprises computational block 101 or processor having random access memory (RAM) 102 and computational logic 103; static random access memory (SRAM) 104, main processor 105, dynamic random access memory (DRAM) 106, and solid-state memory or drive (SSD) 107. In some embodiments, some or all components of AI machine are packaged in a single package forming a system-on-chip (SOC). In some embodiments, computational block 101 is packaged in a single package and then coupled to processor 105 and memories 104, 106, and 107 on a printed circuit board (PCB). In various embodiments, computational block 101 comprises a special purpose compute die 103 or microprocessor. In some embodiments, RAM 102 is a Ferro-electric RAM (Fe-RAM) which forms a special memory/cache for the special purpose compute die 103. In some embodiments, compute die 103 is specialized for applications such as Artificial Intelligence, graph processing and algorithms for data processing. In some embodiments, compute die 103 further has logic computational blocks, for example, for multipliers and buffers, a special data memory block (e.g., buffers) comprising FE-RAM. In some embodiments, FE-RAM 102 has weights and inputs stored in-order to improve the computational efficiency. The interconnects between processor 105 or special purpose processor 105, FE-SRAM 104 and Compute die 103 are optimized for high bandwidth and low latency. The architecture of FIG. 1 allows efficient packaging to lower the energy/power/cost.

In some embodiments, RAM 102 comprises an SRAM which is partitioned to store input data (or data to be processed) 102a and weight factors 102b. In some embodiments, RAM 102 comprises Fe-RAM. For example, RAM 102 comprises FE-DRAM or FE-SRAM. In some embodiments, input data 103a is stored in a separate memory (e.g., a separate memory die) and weight factors 102b are stored in s a separate memory (e.g., separate memory die).

In some embodiments, computational logic 103 comprises matrix multiplier, adder, concatenation logic, buffers, and combinational logic. In various embodiments, computational logic 103 performs multiplication operation on inputs 102a and weights 102b. In some embodiments, weights 102b are fixed weights. For example, processor 105 (e.g., a graphics processor unit (GPU), an AI processor, a central processing unit (CPU), or any other high performance processor) computes the weights for a training model. Once the weights are computed, they are stored in memory 102b. In various embodiments, the input data that is to be analyzed using a trained model is processed by computational block 101 with computed weights 102b to generate an output (e.g., a classification result).

In some embodiments, SRAM 104 is ferroelectric based SRAM. For example, a six transistor (6T) SRAM bit-cells having ferroelectric transistors are used to implement a non-volatile Fe-SRAM. In some embodiments, SSD 107 comprises NAND flash cells. In some embodiments, SSD 107 comprises NOR flash cells. In some embodiments, SSD 107 comprises multi-threshold NAND flash cells.

In various embodiments, the non-volatility of Fe-RAM is used to introduce new features such as security, functional safety, and faster reboot time of architecture 100. The non-volatile Fe-RAM is a low power RAM that provides fast access to data and weights. Fe-RAM 104 can also serve as a fast storage for inference die 101 (or accelerator), which typically has low capacity and fast access requirements.

In various embodiments, the Fe-RAM (Fe-DRAM or Fe-SRAM) includes ferroelectric material. The ferroelectric (FE) material may be in a transistor gate stack or in a capacitor of the memory. The ferroelectric material can be any suitable low voltage FE material that allows the FE material to switch its state by a low voltage (e.g., 100 mV). In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type $h-RMnO_3$, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered $MnO_5$ polyhedra, accompanied by displacements of the Y ions, which lead to a net electric polarization. In some embodiments, hexagonal FE includes one of: $YMnO_3$ or $LuFeO_3$. In various embodiments, when the FE material comprises hexagonal ferroelectrics, the conductive oxides are of $A_2O_3$ (e.g., $In_2O_3$, $Fe_2O_3$) and $ABO_3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are $LuFeO_3$ class of materials or super lattice of ferroelectric and paraelectric materials $PbTiO_3$ (PTO) and $SnTiO_3$ (STO), respectively, and $LaAlO_3$ (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material.

Figure 2:
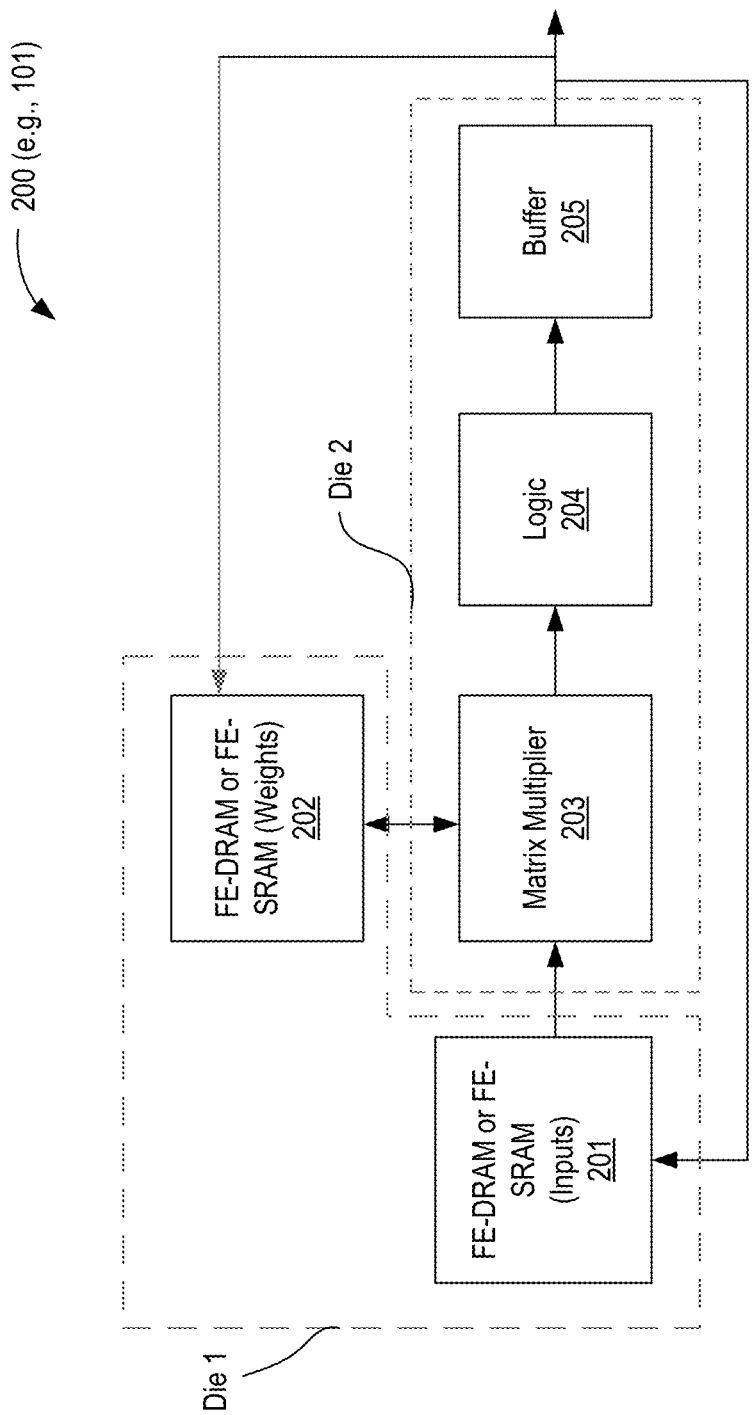
FIG. 2 illustrates an architecture of a computational block comprising a compute die positioned on top of a memory die, in accordance with some embodiments.

FIG. 2 illustrates an architecture of a computational block 200 (e.g., 101) comprising a compute die positioned on top of a memory die, in accordance with some embodiments. The architecture of FIG. 2 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, memory die is a high bandwidth memory (HBM) which comprises multiple dies of memories in a stack and a controller to control the read and write functions to the stack of memory dies. In some embodiments, memory die comprises a first die 201 to store input data and a second die 202 to store weight factors. In some embodiments, memory die is a single die that is partitioned such that first partition 201 of the memory die is used to store input data and second partition 202 of the memory die is used to store weights. In some embodiments, the memory die comprises FE-DRAM. In some embodiments, the memory die comprises FE-SRAM. In some embodiments, the memory die comprises MRAM. In some embodiments, the memory die comprises SRAM. For example, memory partitions 201 and 202, or memory dies 201 and 202 include one or more of: FE-SRAM, FE-DRAM, SRAM, and/or MRAM. In some embodiments, the input data stored in memory partition or die 201 is the data to be analyzed by a trained model with fixed weights stored in memory partition or die 202.

In some embodiments, compute die comprises matrix multiplier 203, logic 204, and temporary buffer 205. Matrix multiplier 203 performs multiplication operation on input data 'X' and weights 'W' to generate an output 'Y'. This output may be further processed by logic 204. In some embodiments, logic 204 performs: a threshold operation, pooling and drop out operations, and/or concatenation operations to complete the AI logic primitive functions. In some embodiments, the output of logic 204 (e.g., processed output 'Y') is temporarily stored in buffer 205. In some embodiments, buffer 205 is memory such as one or more of: Fe-SRAM, Fe-DRAM, MRAM, resistive RAM (Re-RAM) and/or SRAM. In some embodiments, buffer 205 is part of the memory die (e.g., Die 1). In some embodiments, buffer 205 performs the function of a re-timer. In some embodiments, the output of buffer 205 (e.g., processed output 'Y') is used to modify the weights in memory partition or die 202. In one such embodiment, computational block 200 not only operates as an inference circuitry, but also as a training circuitry to train a model. In some embodiments, matrix multiplier 203 includes an array of multiplier cells, wherein the FeRAMs 201 and 202 include arrays of memory bit-cells, respectively, wherein each multiplier cell is coupled to a corresponding memory bit-cell of the FE-RAM 201 and/or FE-RAM 202. In some embodiments, computational block 200 comprises an interconnect fiber coupled to the array of multiplier cells such that each multiplier cell is coupled to the interconnect fiber.

Architecture 200 provides reduced memory accesses for compute die (e.g., die 2) by providing data locality for weights, inputs and outputs. In one example, data from and to the AI computational blocks (e.g., matrix multiplier 203) is locally processed within a same packaging unit. Architecture 200 also segregates the memory and logic operations on to a memory die (e.g., Die 1) and a logic die (e.g., Die 2), respectively, allowing for optimized AI processing. Desegregated dies allow for improved yield of the dies. A high capacity memory process for Die 1 allows reduction of power of the external interconnects to memory, reduces cost of integration, and also results in a smaller foot-print.

Figure 3A:
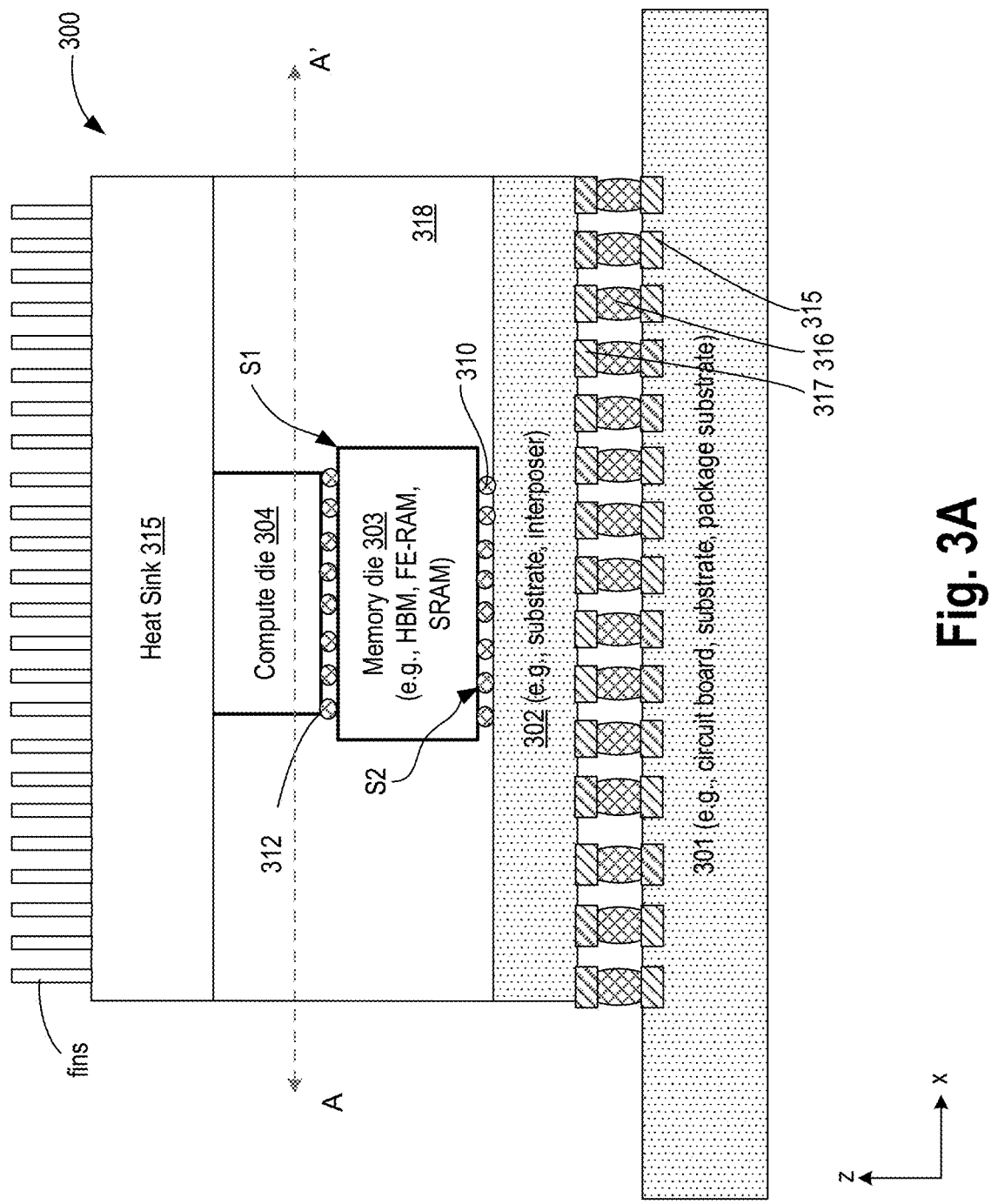
FIG. 3A illustrates a cross-section of a package comprising a computational block, which includes a compute die (e.g., an inference logic die) above a memory die, in accordance with some embodiments.

FIG. 3A illustrates a cross-section of a package 300 comprising a computational block, which includes a compute die (e.g., an inference logic die) above a memory die, in accordance with some embodiments.

In some embodiments, integrated circuity (IC) package assembly is coupled to circuity board 301. In some embodiments, circuit board 301 may be a Printed Circuit Board (PCB) composed of an electrically insulative material such as an epoxy laminate. For example, circuit board 301 may include electrically insulating layers composed of materials such as, phenolic cotton paper materials (e.g., FR-1), cotton paper and epoxy materials (e.g., FR-3), woven glass materials that are laminated together using an epoxy resin (FR-4), glass/paper with epoxy resin (e.g., CEM-1), glass composite with epoxy resin, woven glass cloth with polytetrafluoroethylene (e.g., PTFE CCL), or other polytetrafluoroethylene-based prepreg material. In some embodiments, layer 301 is a package substrate and is part of the IC package assembly.

The IC package assembly may include substrate 302, memory die 303 (e.g., Die 1 of FIG. 2), compute die 304 (e.g., Die 2 of FIG. 2). In various embodiments, memory die 303 is below compute die 304. This particular topology enhances the overall performance of the AI system. In various embodiments, compute die 304 comprises logic portions of an inference die. An inference die or chip is used to apply inputs and fixed weights associated with a trained model to generate an output. By separating the memory 303 associated with inference die 304, the AI performance increases. Further, such topology allows for better use of thermal solution such as heat sink 315, which radiates heat away from the power consuming source, inference die 304. In various embodiments, memory 303 can be one or more of: FE-SRAM, FE-DRAM, SRAM, MRAM, resistance RAM (Re-RAM) or a combination of them. Using PE-SRAM, MRAM, or Re-RAM allows for low power and high-speed memory operation. This allows for placing memory die 303 below compute die 304 to use the thermal solution more efficiently for compute die 304. In some embodiments, memory die 303 is a high bandwidth memory (HBM).

In some embodiments, compute die 304 is an application specific circuit (ASIC), a processor, or some combination of such functions. In some embodiments, one or both of memory die 303 and compute die 304 may be embedded in encapsulant 318. In some embodiments, encapsulant 318 can be any suitable material, such as epoxy-based build-up substrate, other dielectric/organic materials, resins, epoxies, polymer adhesives, silicones, acrylics, polyimides, cyanate esters, thermoplastics, and/or thermosets.

In some embodiments, memory die 303 may have a first side S1 and a second side S2 opposite to the first side S1. In some embodiments, first side S1 may be the side of the die commonly referred to as the "inactive" or "back" side of the die. In sonic embodiments, the backside of memory die 303 may include active or passive devices, signal and power routings, etc. In some embodiments, second side S2 may include one or more transistors (e.g., access transistors), and may be the side of the die commonly referred to as the "active" or "front" side of the die. The memory circuitry of some embodiments can have active and passive devices in the front side of the die too. In some embodiments, second side S2 of memory die 303 may include one or more electrical routing features 310. In some embodiments, compute die 304 may include an "active" or "front" side with one or more electrical routing features 312. In some embodiments, electrical routing features 312 may be bond pads, micro humps, solder balls, or any other suitable coupling technology.

In some embodiments, memory die 302 may include one or more through-silicon vias (TSVs) that couple substrate 302 to compute die 304 via electrical routing features 312. For example, compute die 304 is coupled to memory die 303 by die interconnects. In some embodiments, inter-die interconnects may be solder bumps, copper pillars, or other electrically conductive features. In some embodiments, an interface layer (not shown) may be provided between memory die 303 and compute die 304. Memory die 303 may couple to compute die 304 using TSVs. In some embodiments, interconnect pillars with corresponding solder balls are used to connect memory die 303 with compute die 304. In some embodiments, the interface layer (not shown) may be, or may include, a layer of under-fill, adhesive, dielectric, or other material. In some embodiments, the interface layer may serve various functions, such as providing mechanical strength, conductivity, heat dissipation, or adhesion.

In some embodiments, package substrate 303 may be a coreless substrate. For example, package substrate 302 may be a "bumpless" build-up layer (BBUL) assembly that includes a plurality of "bumpless" build-up layers. Here, the term "bumpless build-up layers" generally refers to layers of substrate and components embedded therein without the use of solder or other attaching means that may be considered "bumps." However, the various embodiments are not limited to BBUL type connections between die and substrate, but can be used for any suitable flip chip substrates. In some embodiments, the one or more build-up layers may have material properties that may be altered and/or optimized for reliability, warpage reduction, etc. In some embodiments, package substrate 504 may be composed of a polymer, ceramic, glass, or semiconductor material. In some embodiments, package substrate 302 may be a conventional cored substrate and/or an interposer. In some embodiments, package substrate 302 includes active and/or passive devices embedded therein.

In some embodiments, the upper side of package substrate 302 is coupled to second surface S2 and/or electrical routing features 310 of memory die 303. In some embodiments, a lower opposite side of package substrate 302 is coupled to circuit board 301 by package interconnects 317. In some embodiments, package interconnects 316 may couple electrical routing features 317 disposed on the second side of package substrate 504 to corresponding electrical routing features 315 on circuit board 301.

In sonic embodiments, package substrate 504 may have electrical routing features formed therein to route electrical signals between memory die 303 (and/or compute die 304) and circuit board 301 and/or other electrical components external to the IC package assembly. In some embodiments, package interconnects 316 and die interconnects 310 include any of a wide variety of suitable structures and/or materials including, for example, bumps, pillars or balls formed using metals, alloys, solderable material, or their combinations. In some embodiments, electrical routing features 315 may be arranged in a ball grid array ("BGA") or other configuration.

In some embodiments, compute die 304 is coupled to memory die 303 in a front-to-hack configuration (e.g., the "front" or "active" side of compute die 303 is coupled to the "back" or "inactive" side S1 of memory die 303). In some embodiments, dies may be coupled with one another in a front-to-front, back-to-back, or side-to-side arrangement. In some embodiments, one or more additional dies may be coupled with memory die 303, compute die 304, and/or with package substrate 302. In some embodiments, the IC package assembly may include, for example, combinations of flip-chip and wire-bonding techniques, interposers, multichip package configurations including system-on-chip (SoC) and/or package-on-package (PoP) configurations to route electrical signals.

In some embodiments, memory die 303 and compute die 304 may be single dies. In some embodiments, memory die 303 is a HBM that includes two or more dies, wherein the two or more dies include a controller die and memory die(s). In sonic embodiments, compute die may include two more dies. For example, buffer 205 maybe a separate memory die coupled closer to surface S1 of memory die 303 and matrix multiplication and other computational units may be in a separate die. In one example, memory die 303 and/or compute die 304 may be a wafer (or portion of a wafer) having two or more dies formed on it. In some embodiments, memory die 303 and/or compute die 304 includes two or more dies embedded in encapsulant 318. In some embodiments, the two or more dies are arranged side-by-side, vertically stacked, or positioned in any other suitable arrangement, In various embodiments, a heat sink 315 and associated fins are coupled to compute die 304. While heat sink 315 is shown as a thermal solution, other thermal solutions may also be used. For example, fan, liquid cooling, etc. may be used in addition to or instead of heat sink 315.

Figure 3B:
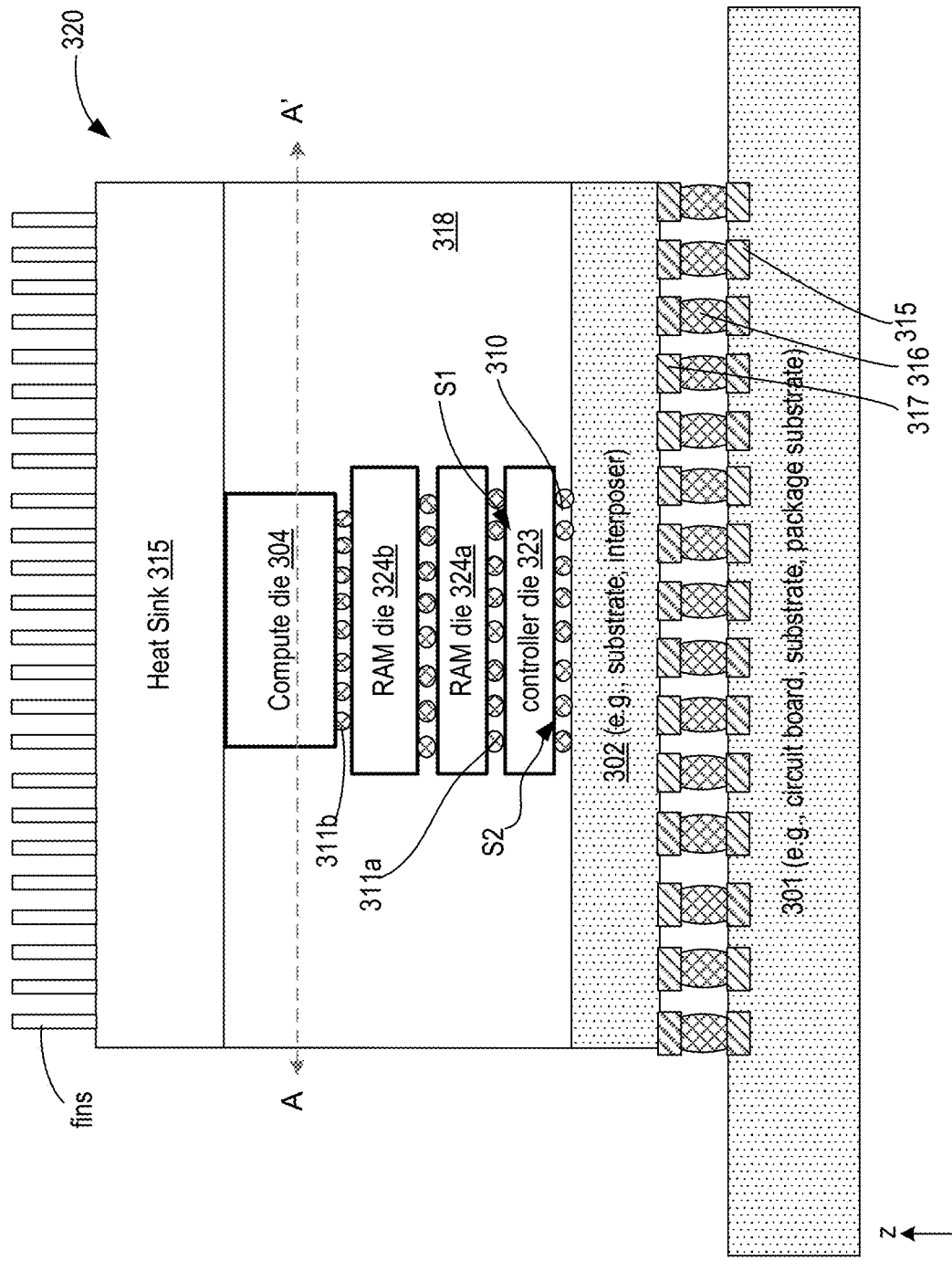
FIG. 3B illustrates a cross-section of a package comprising a computational block, which includes a compute die (e.g., an inference logic die) above a stack of memory dies and a controller logic die, in accordance with some embodiments.

FIG. 3B illustrates a cross-section of a package 320 comprising a computational block, which includes a compute die (e.g., an inference logic die) above a stack of memory dies and a controller logic die, in accordance with some embodiments. So as not to obscure the embodiment of FIG. 320, differences between package 300 and 320 are discussed. Here, memory die 303 is replaced with a controller die 323 and a stack of memory dies (RAMs) 324*b* and 324*b*. In some embodiments, controller die 323 is a memory controller, which includes read logic, write logic, column and row multiplexers, error correction logic, interface with RAMs 324*a/b*, interface with compute die 304, and interface with substrate 302. In various embodiments, memory dies 324*a/b* are placed or stacked above controller die 323. In some embodiments, RAMs 324*a/b* are one or more of:

FE-SRAM, FE-DRAM, SRAM, MRAM, Re-RAM or a combination of them. In some embodiments, RAM die 324*a* is used to store inputs while RAM die 324l) are used to store the weights. In some embodiments, any of the RAM dies 324*a/b* can also include memory for buffer 205. While the embodiment of FIG. 3B illustrates two RAM dies, any number of RAM dies can be stacked over controller die 323.

Figure 3C:
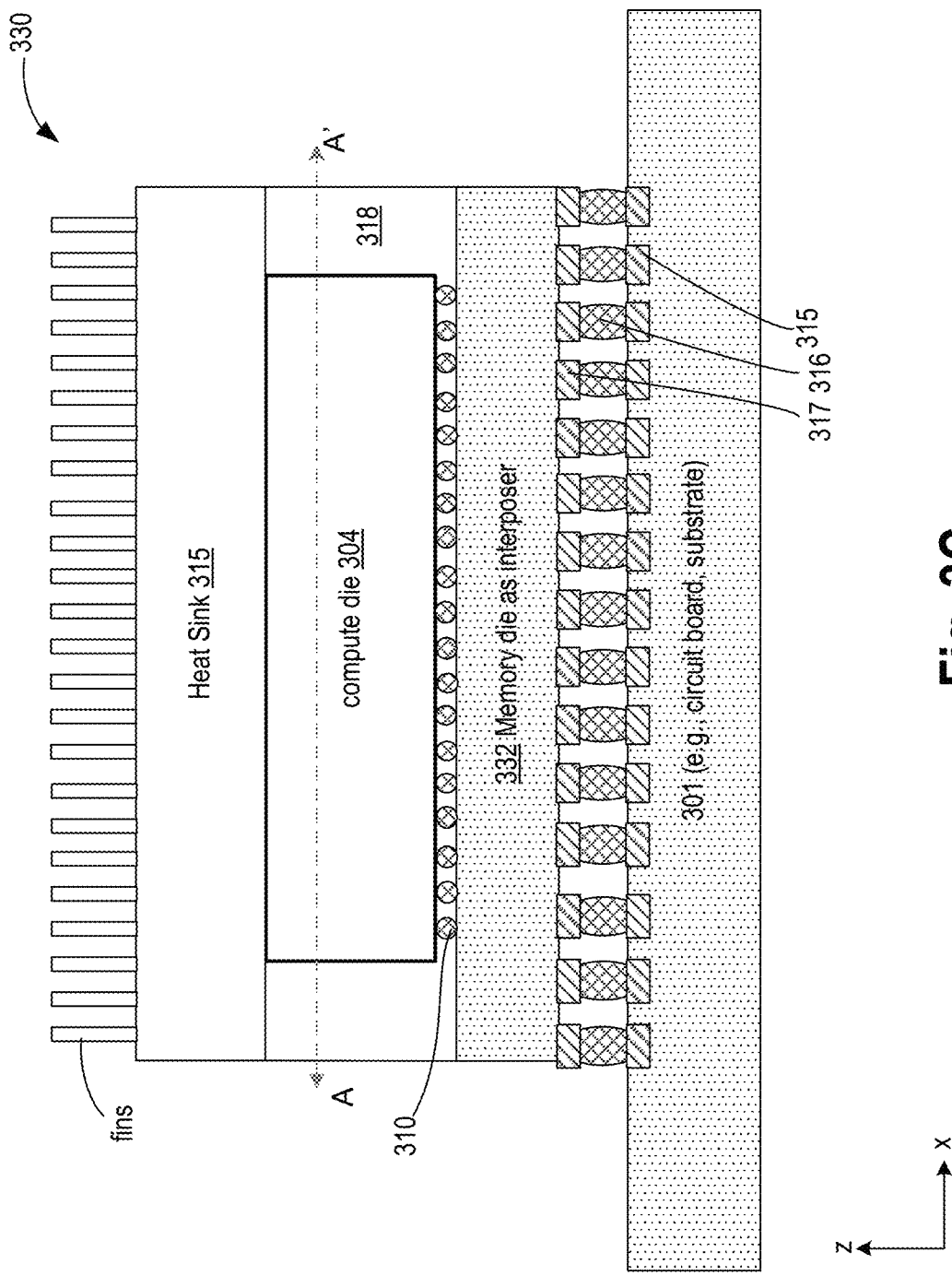
FIG. 3C illustrates a cross-section of a package comprising a computational block, which includes a compute die over a memory that also functions as an interposer, in accordance with some embodiments.

FIG. 3C illustrates a cross-section of a package 330 comprising a computational block, which includes compute die 304 over a memory that also functions as an interposer, in accordance with some embodiments. Compared to package 300, here memory die 303 is removed and integrated in interposer 332 such that the memory provides storage function as well as a function of an interposer. This configuration allows for reducing package cost. Interconnections 310 now electrically couple compute die 304 to memory 332. Memory 332 may comprise FE-SRAM, FE-DRAM, SRAM, MRAM, Re-RAM or a combination of them.

Figure 3D:
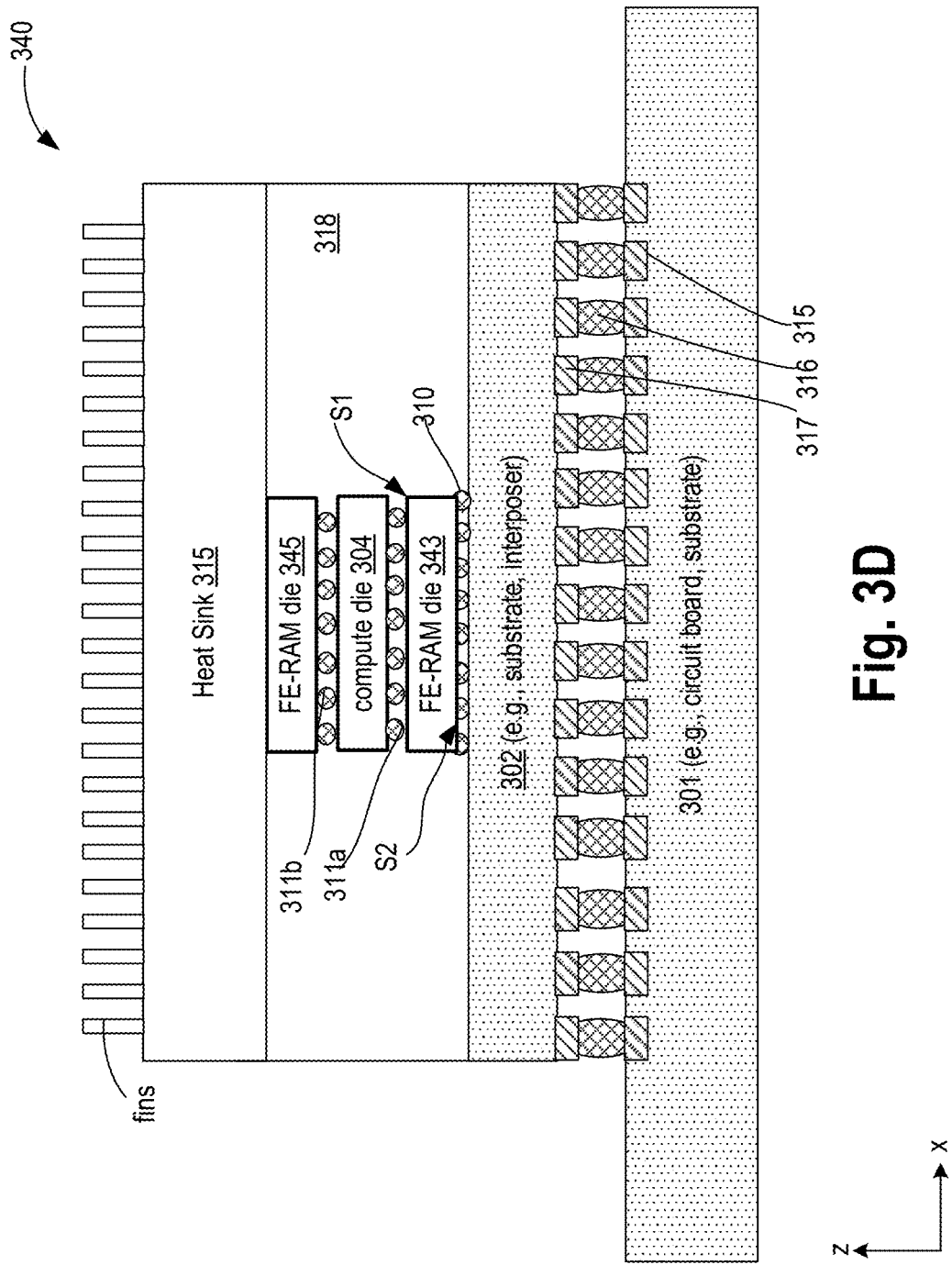
FIG. 3D illustrates a cross-section of a package comprising a computational block, which includes a compute die between memory dies in a horizontal stack along the plane of the package, in accordance with some embodiments.

FIG. 3D illustrates a cross-section of a package 340 comprising a computational block, which includes a compute die between memory dies in a horizontal stack along the plane of the package, in accordance with some embodiments. Compared to package 300, here compute die 304 is positioned between memories 343 and 345 such that RAM die 343 is coupled to substrate 302 via interconnections 310. In various embodiments, compute die 304 communicates with RAM dies 343 and 345 through both its front-side and back-side via interconnections 311*a* and 113*b*, respectively. This embodiment allows compute die 304 to efficiently use its real-estate by applying active devices on its frontend and backend. RAM dies 343/345 may comprise FE-SRAM, FE-DRAM, SRAM, MRAM, Re-RAM or a combination of them. In some embodiments, RAM die 343 is used to store inputs while RAM die 345 is used to store the weights. In some embodiments, any of the RAM dies 343 or 345 can also include memory for buffer 205. While the embodiment of FIG. 3D illustrates two RAM dies, any number of RAM dies can be stacked over and below compute die 304.

Figure 3E:
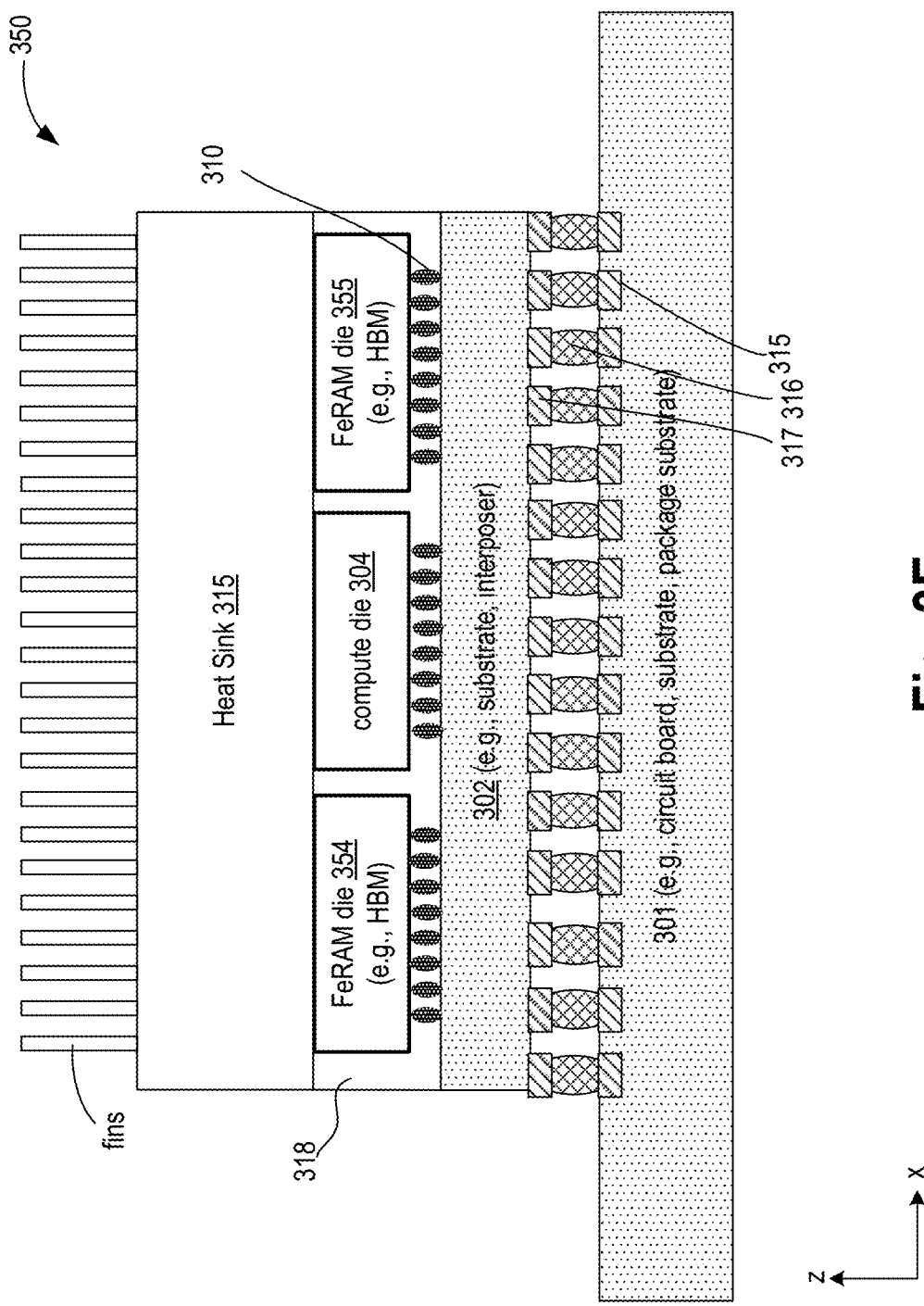
FIG. 3E illustrates a cross-section of a package comprising a computational block, which includes a compute die and two or more memories along a plane of the package, in accordance with some embodiments.

FIG. 3E illustrates a cross-section of a package 350 comprising a computational block, which includes a compute die and two or more memories along a plane of the package, in accordance with some embodiments. Compared to package 300, here compute die 304 is in the middle and memory dies 354 and 355 are on either sides of compute die 304. In some embodiments, memory dies surround compute die 304. AI processing is memory intensive. Such an embodiment allows compute die 304 to access memory from its four sides. Heat sink 315 in this case is coupled to the memory dies 354 and 355 and compute die 304. RAM dies 354 and 355 may comprise FE-SRAM, FE-DRAM, SRAM, MRAM, Re-RAM or a combination of them. RAM dies 354 and 355 may include HBM. Each HBM comprises two or more memory dies and a controller. In some embodiments, RAM die 354 is used to store inputs while RAM die 355 is used to store the weights. In some embodiments, any of the RAM dies 354 or 355 can also include memory for buffer 205. While the embodiment of FIG. 3E illustrates two RAM dies, any number of RAM dies can be positioned along the sides of compute die 304.

Figure 3F:
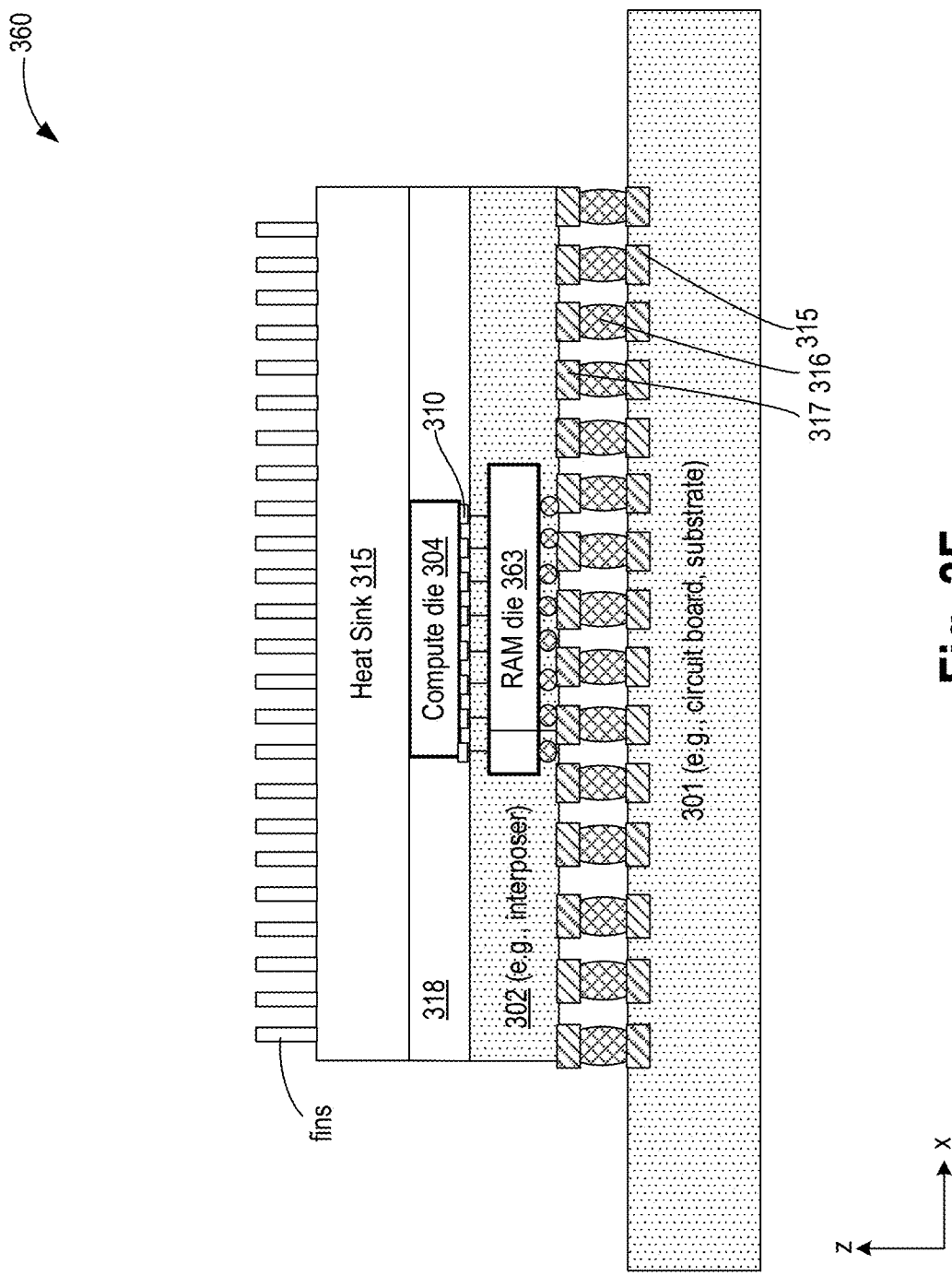
FIG. 3F illustrates a cross-section of a package comprising a computational block, which includes a compute die over an interposer, wherein the interposer comprises a memory die embedded in it, in accordance with some embodiments.

FIG. 3F illustrates a cross-section of a package 360 comprising a computational block, which includes a compute die over an interposer, wherein the interposer comprises a memory die embedded in it, in accordance with some embodiments. Compared to package 300, here memory die 363 is embedded in substrate or interposer 302. This embodiment allows for reducing the z-height of the package and also reduces the latency of singles two and from compute die 304 to other devices couples to substrate 301. RAM die 363 may comprise FE-SRAM, FE-DRAM, SRAM, MRAM, Re-RAM or a combination of them. RAM die 363 may include I-IBM. Each I-IBM comprises two or more memory dies and a controller. While the embodiment of FIG. 3F illustrates one RAM die 363, any number of RAM dies can be embedded in interposer 302.

Figure 3G:
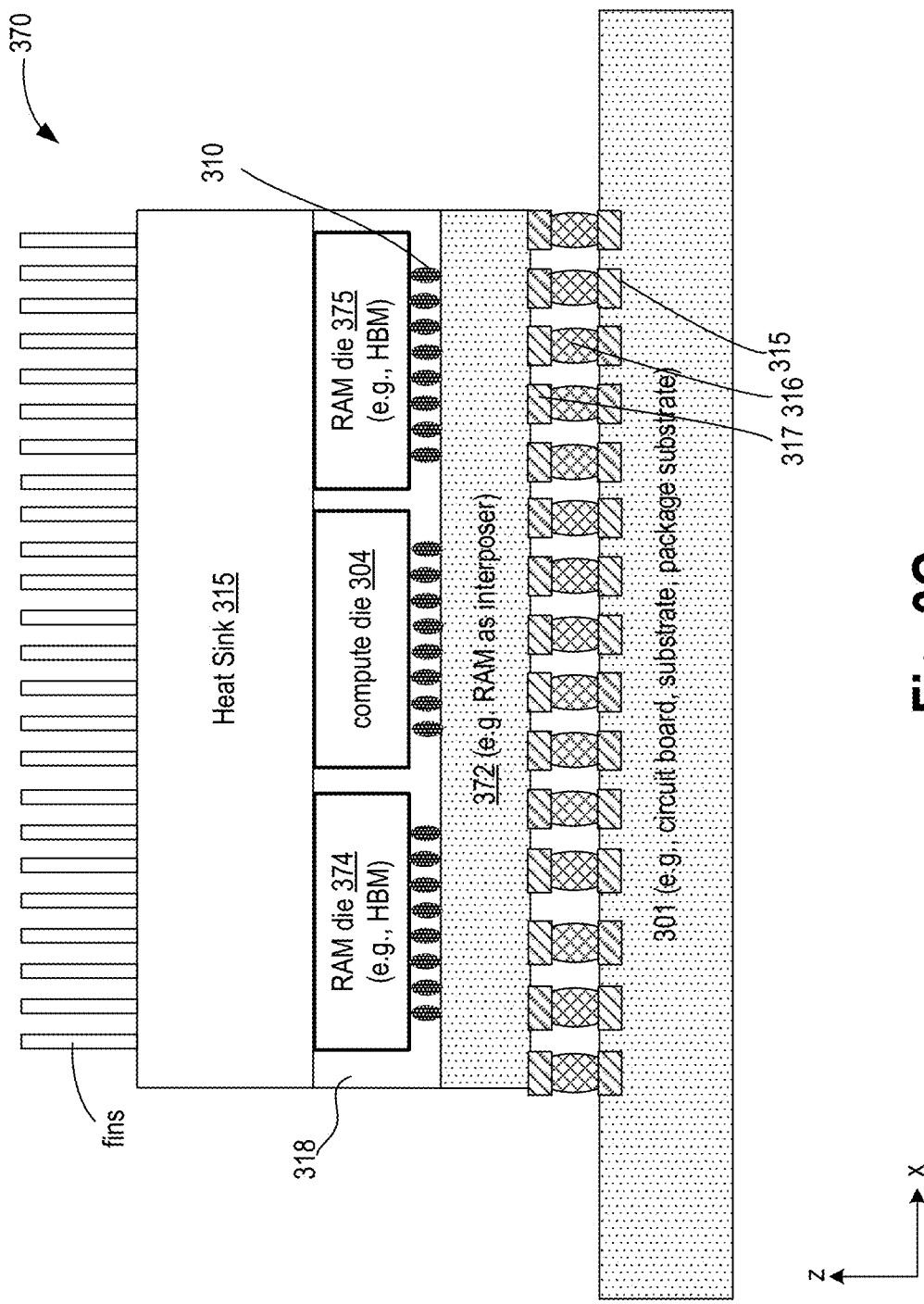
FIG. 3G illustrates a cross-section of a package comprising a computational block, which includes a compute die and two or more memories along a plane of the package, and a memory that also functions as an interposer, in accordance with some embodiments.

FIG. 3G illustrates a cross-section of a package 370 comprising a computational block, which includes a compute die and two or more memories along a plane of the package, and a memory that also functions as an interposer, in accordance with some embodiments. Compared to package 350, here memory 374 and 375 on the sides of compute die are RAMs (e.g., SRAM, Fe-RAM, MRAM, or Re-RAM). In various embodiments, interposer 302 is replaced with a memory that behaves as an interposer. The memory can be one of: FE-RAM, MRAM, Re-RAM, or SRAM. In some embodiments, the memory in the interposer is a three dimensional (3D) Fe-RAM stack that also functions as an interposer. In some embodiments, the 3D memory stack is a stack of MRAMs, Re-RAMs, or SRAMs.

Figure 3H:
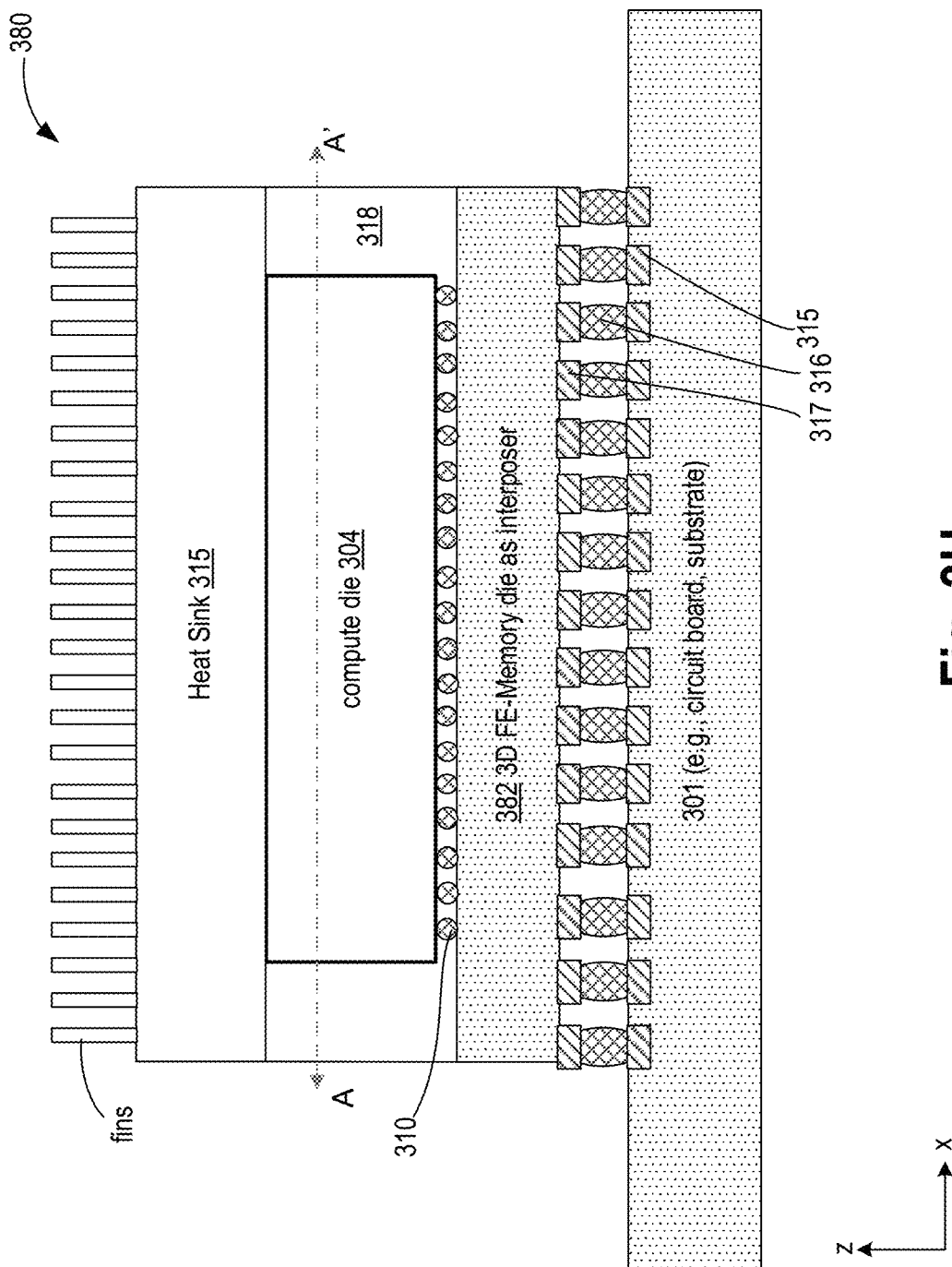
FIG. 3H illustrates a cross-section of a package comprising a computational block, which includes a compute die over a 3D ferroelectric memory that also functions as an interposer, in accordance with some embodiments.

FIG. 3H illustrates a cross-section of a package 380 comprising a computational block, which includes a compute die over a 3D ferroelectric memory that also functions as an interposer, in accordance with some embodiments. Compared to package 330, in various embodiments, memory interposer 332 is replaced with a three dimensional (3D) Fe-RAM stack that also functions as an interposer. In some embodiments, the 3D memory stack is a stack of MRAMs, Re-RAMs, or SRAMs.

Figure 4A:
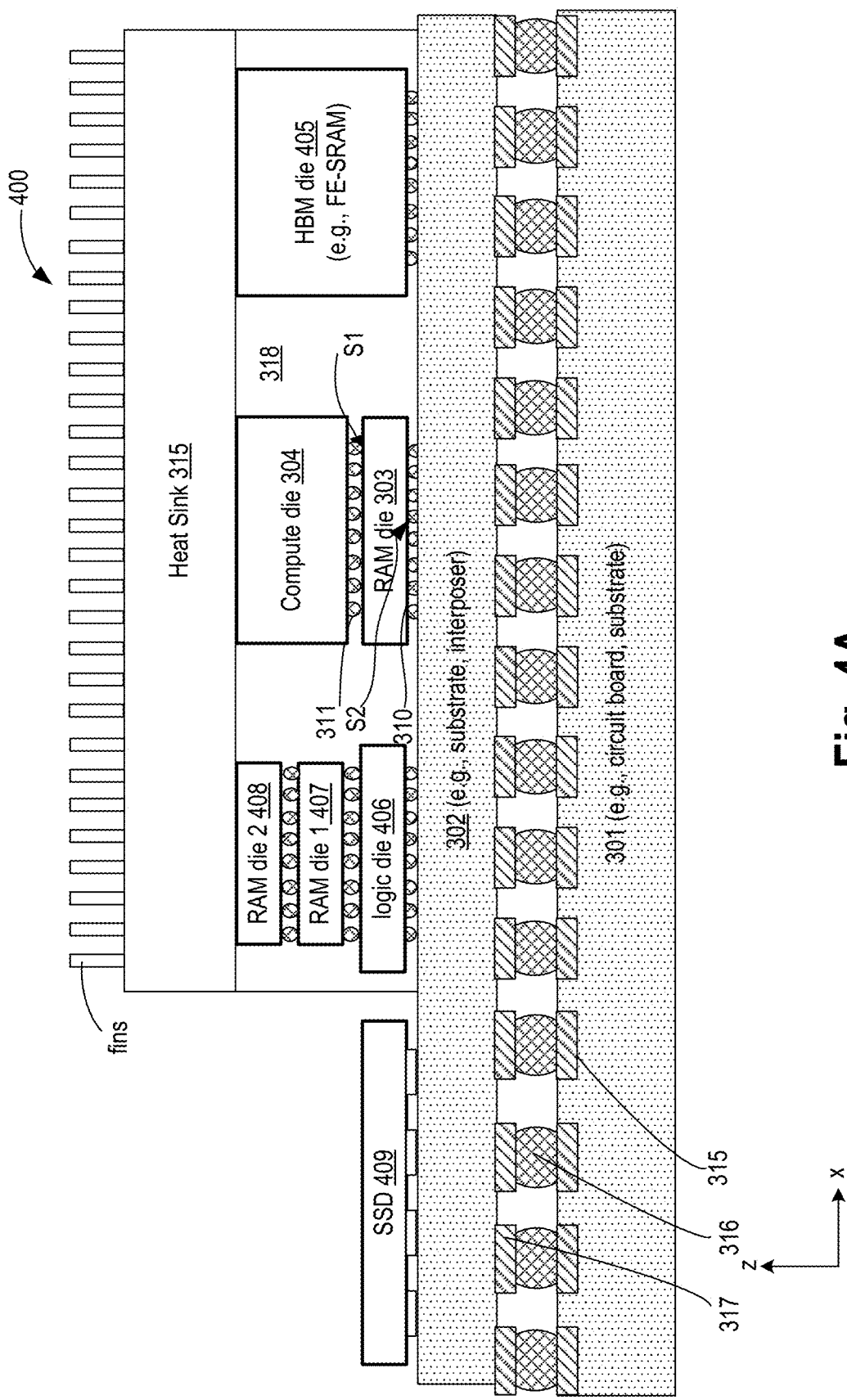
FIG. 4A illustrates a cross-section of package comprising an AI machine, which includes a system-on-chip (SOC) having a computational block, which includes a compute die over a memory, in accordance with some embodiments.

FIG. 4A illustrates a cross-section of package 400 comprising an AI machine, which includes a system-on-chip (SOC) having a computational block, which includes a compute die over a memory, in accordance with some embodiments. Package 400 comprises processor die 406 coupled to substrate or interposer 302. Two or more memory dies 407 (e.g., memory 104) and 408 (e.g., memory 106) are stacked on processor die 406. Processor die 406 (e.g., 105) can be any one of: central processing unit (CPU), graphics processor unit (GPU), application specific integrated circuit (ASIC). Memory (RAM) dies 407 and 408 may comprise FE-SRAM, FE-DRAM, SRAM, MRAM, Re-RAM or a combination of them. In some embodiments, RAM dies 407 and 408 may include HBM. In some embodiments, one of memories 104 and 106 is implemented as HBM in die 405. The memories in HBM die 405 include any one or more of: FE-SRAM, FE-DRAM, SRAM, MRAM, Re-RAM or a combination of them. Heat sink 315 provides a thermal management solution to the various dies in encapsulant 318. In some embodiments, solid-state drive (SSD) 409 is positioned outside of first package assembly that includes heat sink 315. In some embodiments, SSD 409 includes one of NAND flash memory, NOR flash memory, or any other type of non-volatile memory such as MRAM, FE-DRAM, FE-SRAM, Re-RAM etc.

Figure 4B:
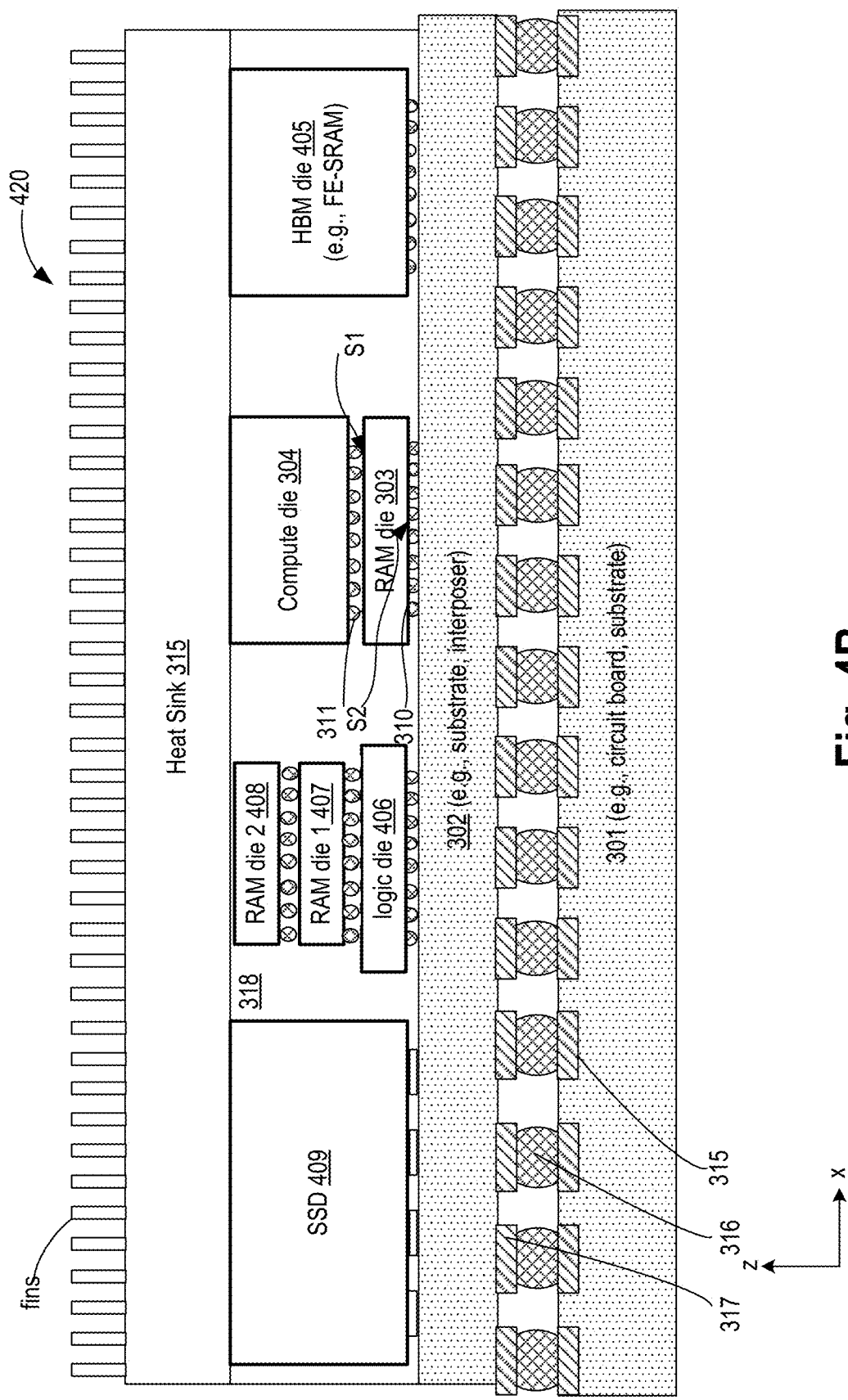
FIG. 4B illustrates a cross-section of a package comprising an AI machine, which includes an SOC having a computational block, which includes a compute die over a memory, a processor, and a solid-state memory, in accordance with some embodiments.

FIG. 4B illustrates a cross-section of package 420 comprising an AI machine, which includes an SOC having a computational block, which includes a compute die over a memory, a processor, and a solid-state memory, in accordance with some embodiments. Package 420 is similar to package 400 but for incorporating SSD 409 within a single package under a common heat sink 315. In this case, a single packaged SOC provides an AI machine which includes the capability of generating a training model and then using the trained model for different data to generate output.

Figure 5:
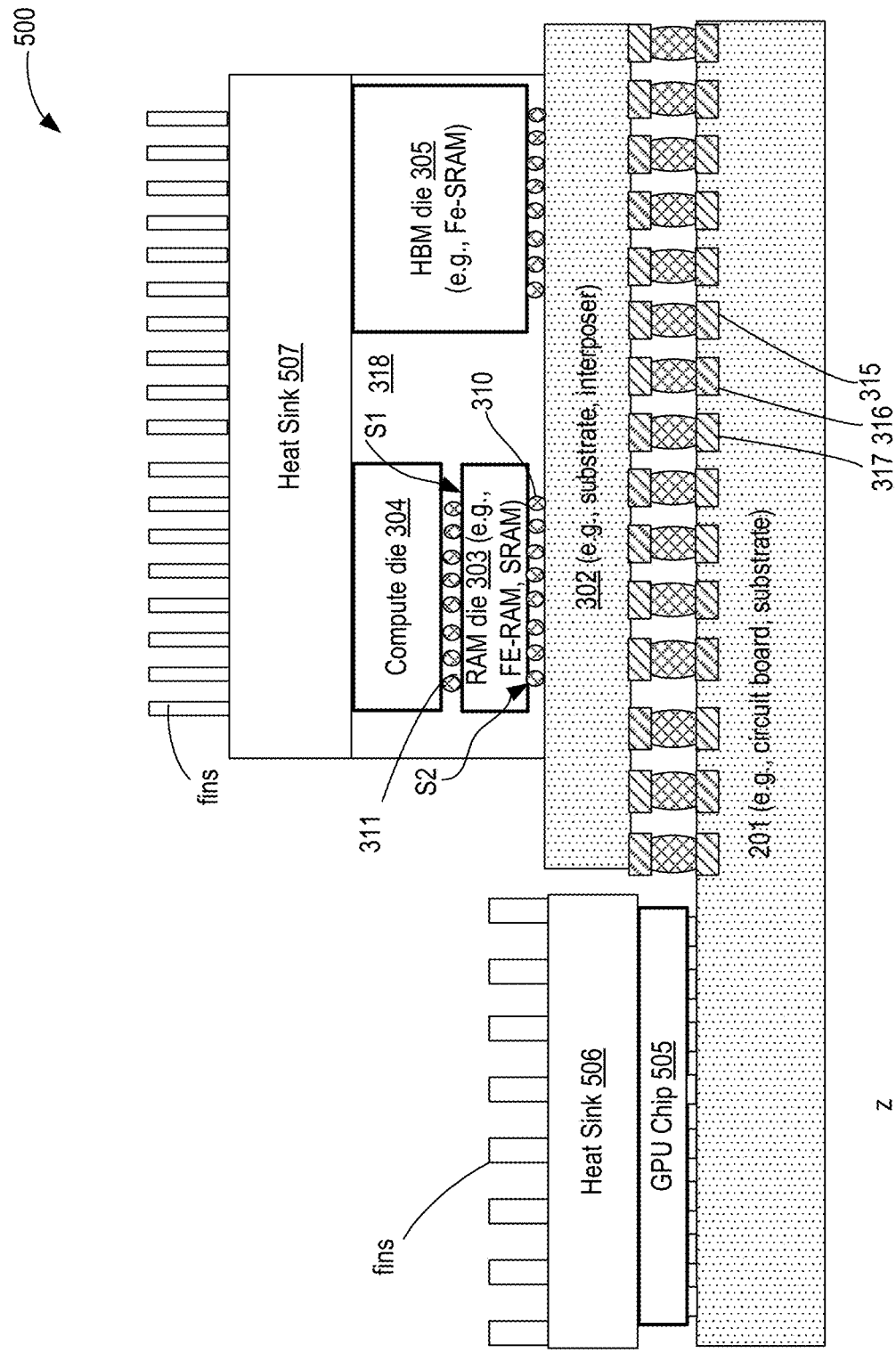
FIG. 5 illustrates a cross-section of multiple packages on a circuit board, where one of the packages includes a compute die over a memory die, and another of the packages includes a graphics processor unit, in accordance with some embodiments.

FIG. 5 illustrates a cross-section 500 of multiple packages on a circuit board, where one of the packages includes a compute die over a memory die, and another of the packages includes a graphics processor unit, in accordance with some embodiments. In this example, an AI processor such as CPU 505 is coupled to substrate 201 (e.g., PCB). Here, two packages are shown—one with heat sink 506 and the other with heat sink 507. Heat sink 506 is a dedicated thermal solution for GPU chip 505 while heat sink 507 provides a thermal solution for the computational block (dies 303 and 304) with HBM 305.

Figure 6:
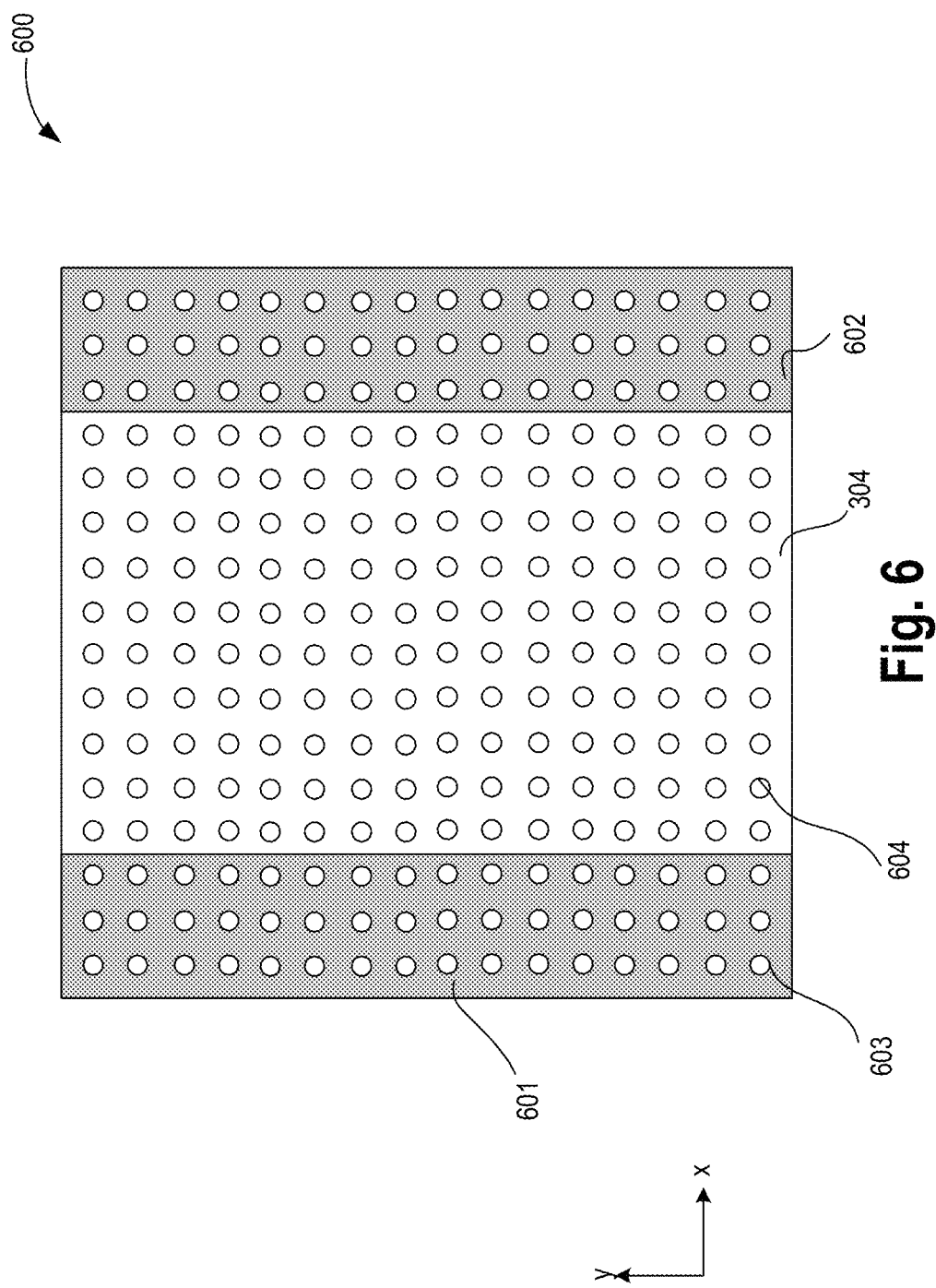
FIG. 6 illustrates a cross-section of a top view of the compute die with micro-humps on the sides to connect with memories along a horizontal plane, in accordance with some embodiments.

FIG. 6 illustrates a cross-section of a top view 600 of compute die 304 with micro-humps on the sides to connect with memories along a horizontal plane, in accordance with some embodiments. The shaded regions 601 and 602 on either side of compute die 304 include micro-bumps 603 (e.g., 310) that are used to connect to memories on either side of compute die 304. For example, as shown in FIG. 3E, HBM 354 and 355 are coupled to compute die 304 via micro-bumps 603. Micro-bumps 604 may be used to connect to substrate 302 or interposer 302.

Figure 7:
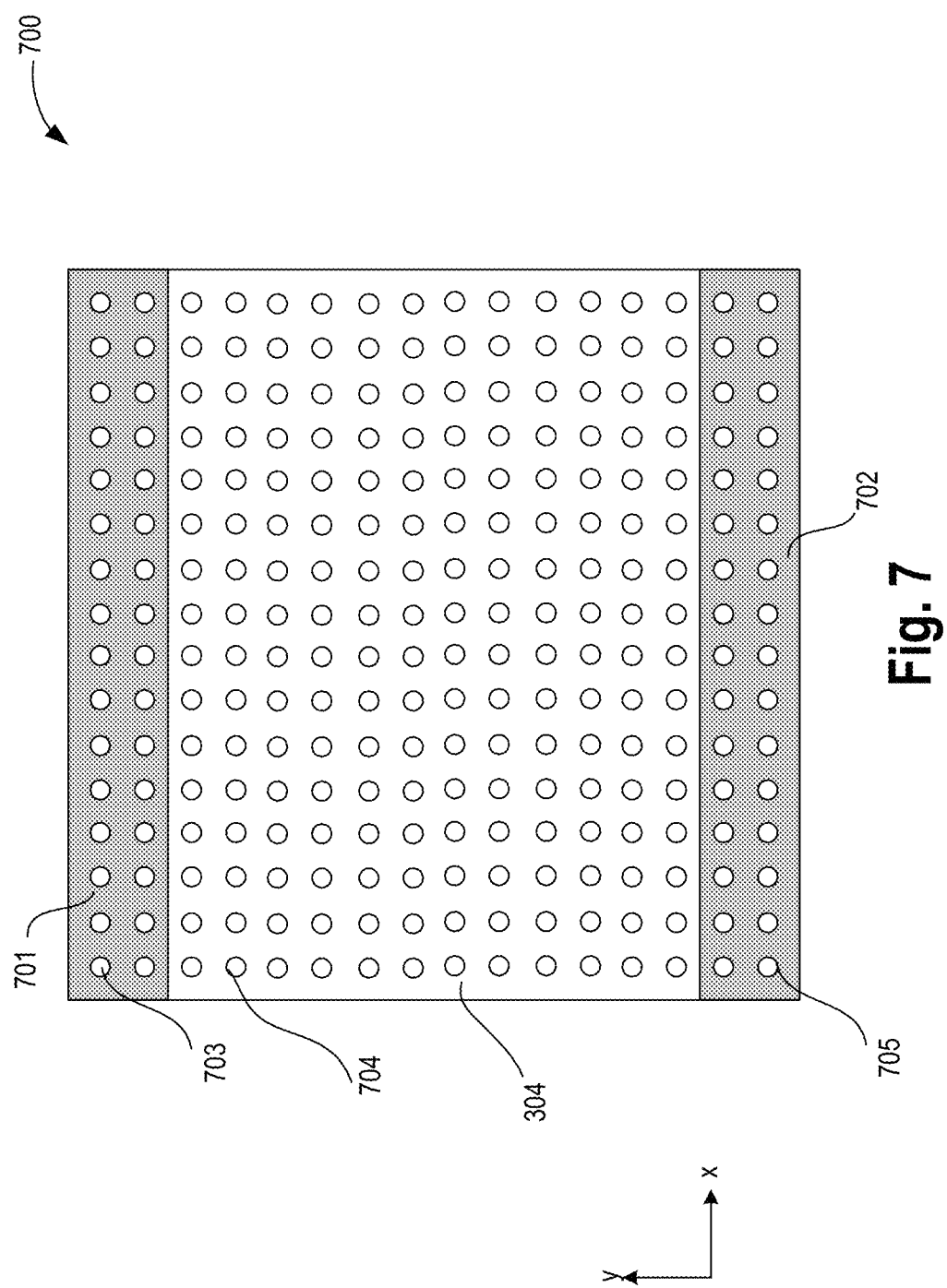
FIG. 7 illustrates a cross-section of a top view of the compute die with micro bumps on the top and bottom of the compute die to connect with memory dies along a vertical plane of the package, in accordance with some embodiments.

FIG. 7 illustrates a cross-section of a top view 700 of compute die 304 with micro bumps on the top and bottom of the compute die to connect with memory dies along a vertical plane of the package, in accordance with some embodiments. The shaded regions 701 and 702 on upper and lower side sections of compute die 304 include micro-bumps 703 (e.g., 311a and 311b) that are used to connect to upper and lower memories 345 and 343, respectively. For example, as shown in FIG. 3E, FE-RAMs 343 and 345 are coupled to compute die 304 via micro-bumps 311a and 311b, respectively. Micro-bumps 704 may be used to connect to substrate 302 or interposer 302.

Figure 8:
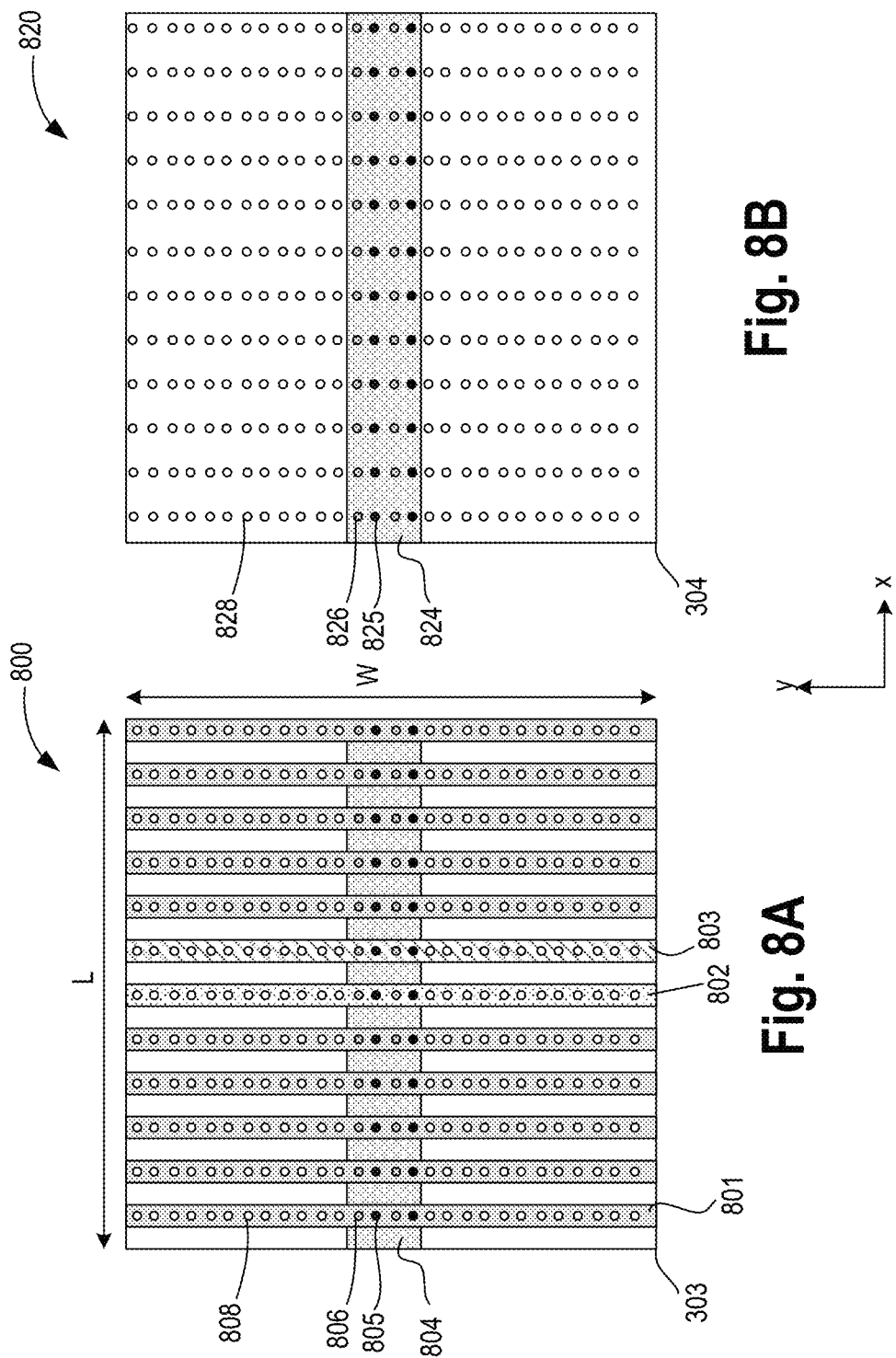
FIG. 8A illustrates a cross-section of a memory die, which is below the compute die, in accordance with some embodiments.
FIG. 8B illustrates a cross-section of a compute die, which is above the memory die, in accordance with some embodiments.

FIG. 8A illustrates a cross-section 800 of a memory die (e.g., 303 or 333), which is below compute die 304, in accordance with some embodiments. Memory die 303 has a pitch of L×W. Cross-section 800 shows strips of TSVs that are used to connect to compute die 304. Strips of shade 801 carry signals while strips 802 and 803 carry power and ground lines. Strip 804 provides power and ground signals 805 and 806 to the memory cells within a row. TSVs 808 connect signals (e.g., word-line) to memory bit cells.

FIG. 8B illustrates a cross-section 820 of a compute die (e.g., 304), which is above the memory die (e.g., 303), in accordance with some embodiments. TSVs 828 may couple to TSVs 808 while strip 824 is over strip 804. TSVs 825 and 826 couple to TSVs 805 and 806, respectively.

Figure 9:
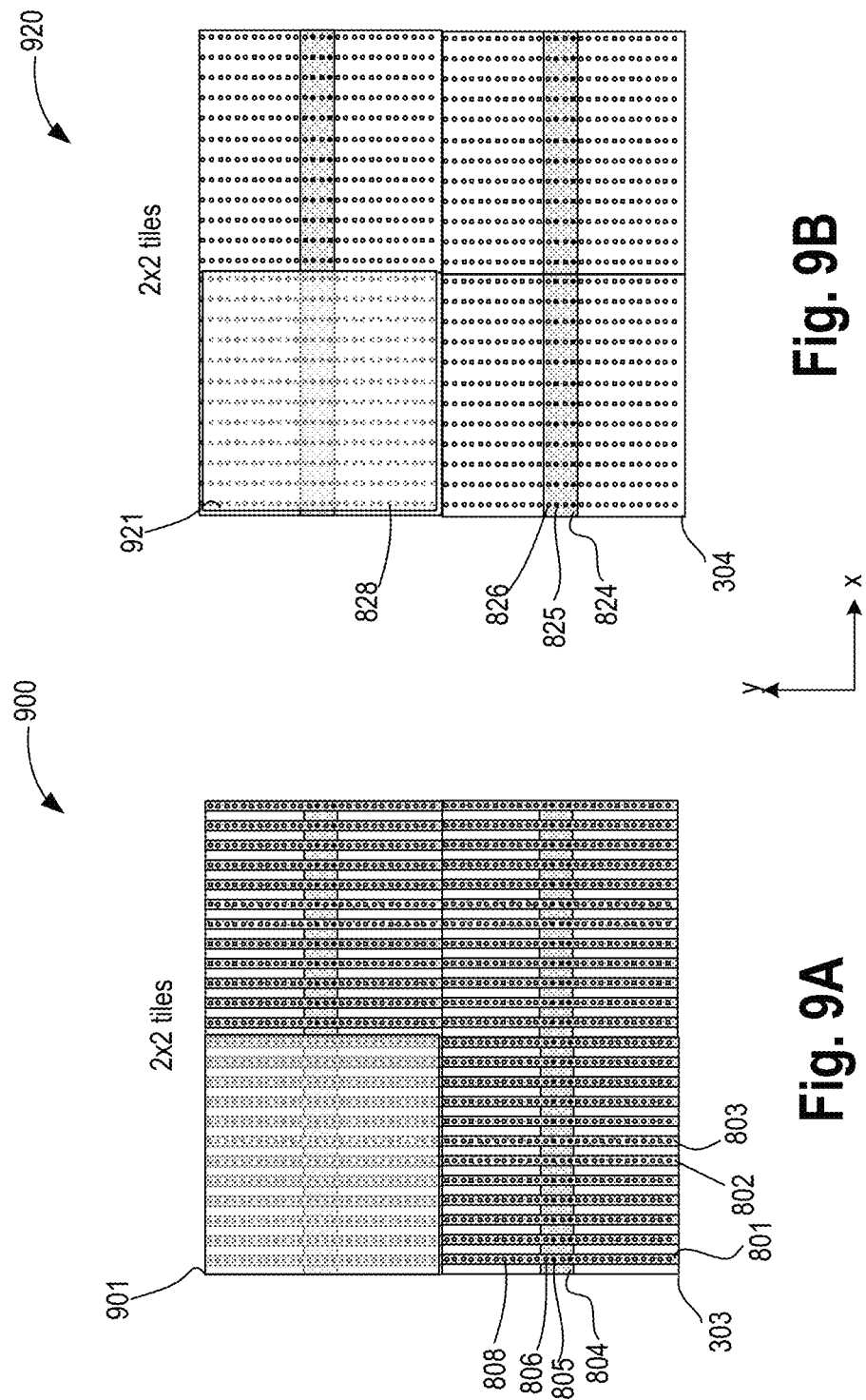
FIG. 9A illustrates a cross-section of a memory die with 2×2 tiles, which is below the compute die, in accordance with some embodiments.
FIG. 9B illustrates a cross-section of a compute die with 2×2 tiles, which is above the memory die, in accordance with some embodiments.

FIG. 9A illustrates cross-section 900 of a memory die 303 with 2×2 tiles, which is below the compute die, in accordance with some embodiments. While memory die 202 of FIG. 8A illustrates a single tile, here 2×2 tile is used for organize the memory. This allows to cleanly partition the memory for storing data and weights. Here, a tile is indicated by tile 901. The embodiments are not limited to 2×2 tiles and organization of M×N tiles (where M and N are integers that may be equal or different).

FIG. 9B illustrates cross-section 920 of a compute die with 2×2 tiles, which is above the memory die, in accordance with some embodiments. Like memory 303, compute die 304 can also be partitioned into tiles. Each tile 921 is like a compute die 304 of FIG. 8B, in accordance with some embodiments. Such an organization of compute die 304 allows to run different training models with different input data and weight simultaneously or in parallel.

Figure 10:
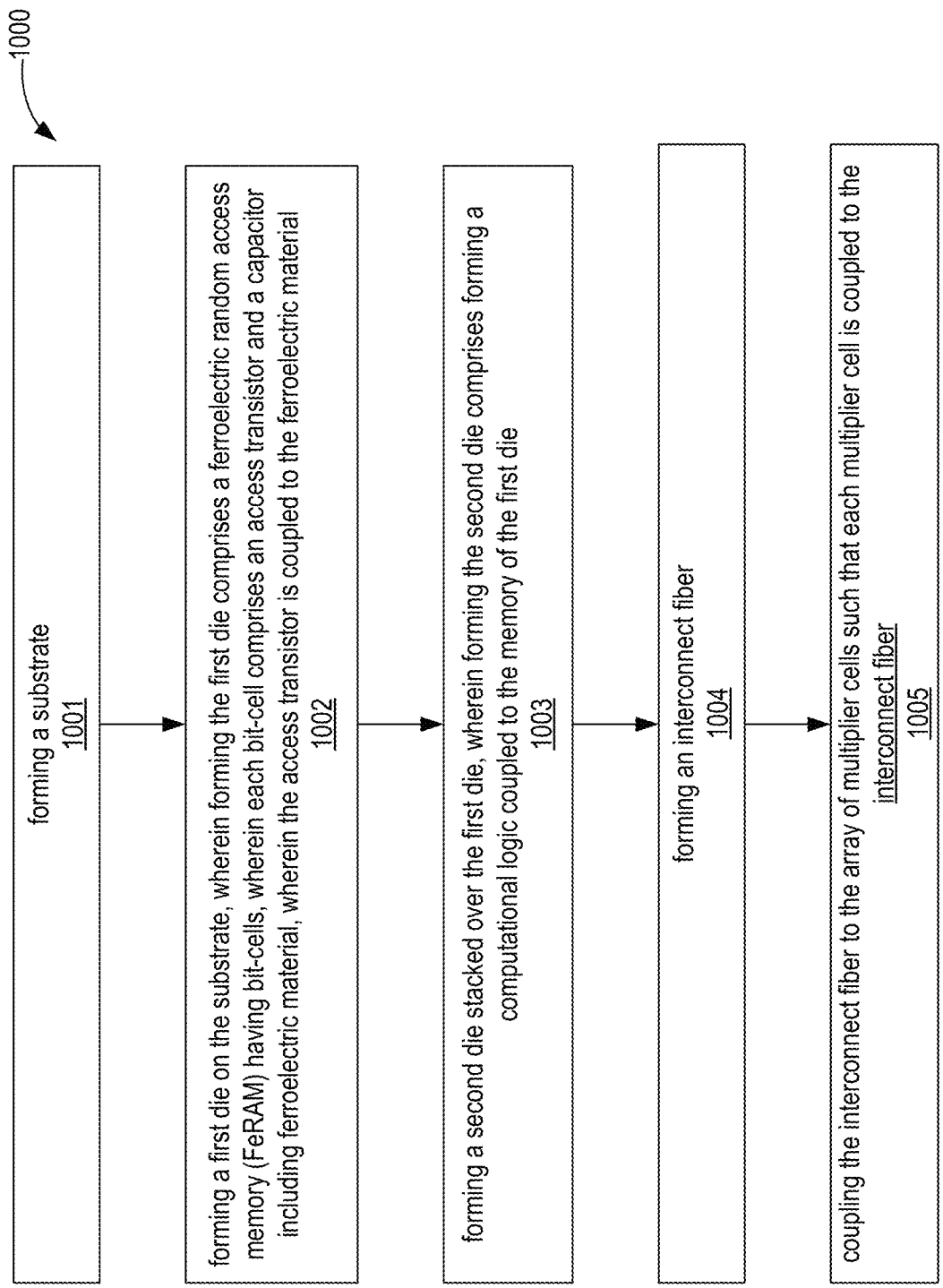

FIG. 10 illustrates a flowchart 1000 of a method of forming a package of a computational block, which includes a compute die (e.g., an inference logic die) above a memory die, in accordance with some embodiments. The blocks in the flowchart 1000 are illustrated in a particular order. However, the order of the various processing steps can be modified without changing the essence of the embodiments. For example, some processing blocks may be processed simultaneously, while others may be performed out of order.

At block 1001, a substrate (e.g., 302) is formed. In some embodiments, substrate 302 is package substrate. In some embodiments, substrate 302 is an interposer (e.g. active or passive interposer). At block 1002, a first die (e.g., 303) is formed on the substrate. In some embodiments, forming the first die comprises a ferroelectric random access memory (FeRAM) having bit-cells, wherein each bit-cell comprises an access transistor and a capacitor including ferroelectric material, wherein the access transistor is coupled to the ferroelectric material. At block 1003, a second die (e.g., compute die 304) is formed and stacked over the first die, wherein forming the second die comprises forming a computational logic coupled to the memory of the first die. In some embodiments, forming the computational logic includes forming an array of multiplier cells, and wherein the FeRAM includes an array of memory bit-cells.

At block 1004, an interconnect fiber is formed. At block 1005, the interconnect fiber is coupled to the array of multiplier cells such that each multiplier cell is coupled to the interconnect fiber. In some embodiments, the FeRAM is partitioned into a first partition operable as buffers; and a second partition to store weight factors.

In some embodiments, the method of flowchart 1000 comprises: receiving data by the computational logic from the first partition and the second partition; and providing an output of the computational logic to a logic circuitry. In some embodiments, forming the computational logic comprises forming ferroelectric logic. In some embodiments, the computational logic is operable to multiply at least two matrices. In some embodiments, the method of forming the substrate comprises forming active or passive devices. In some embodiments, the method comprises: forming a third die (e.g., a logic die or a memory) on the substrate. In some embodiments, the method comprises coupling the third die on the substrate. In some embodiments, the method comprises a fourth die comprising dynamic random access memory (DRAM); and stacking the fourth die over the third die. In some embodiments, the method comprises coupling a heat sink to the second die.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

EXAMPLE 1

An apparatus comprising: a substrate; a first die on the substrate, wherein the first die comprises a ferroelectric random access memory (FeRAM) having bit-cells, wherein each bit-cell comprises an access transistor and a capacitor including ferroelectric material, wherein the access transistor is coupled to the ferroelectric material; and a second die stacked over the first die, wherein the second die comprises a computational logic coupled to the memory of the first die.

EXAMPLE 2

The apparatus of example 1, wherein the computational logic includes an array of multiplier cells, and wherein the FeRAM includes an array of memory bit-cells.

EXAMPLE 3

The apparatus of example 2 comprising an interconnect fiber coupled to the array of multiplier cells such that each multiplier cell is coupled to the interconnect fiber.

EXAMPLE 4

The apparatus of example 1, wherein the memory is partitioned into a first partition operable as buffers; and a second partition to store weight factors.

EXAMPLE 5

The apparatus of example 4, wherein the computational logic is to receive data from the first partition and the second partition, and wherein an output of the computational logic is received by logic circuitry.

EXAMPLE 6

The apparatus of example 4, wherein the computational logic comprises ferroelectric logic.

EXAMPLE 7

The apparatus of example 4 wherein the computational logic is operable to multiply at least two matrices.

EXAMPLE 8

The apparatus of example 1, wherein the substrate comprises active or passive devices.

EXAMPLE 9

The apparatus of example 1, wherein a third die is coupled on the substrate, and wherein a fourth die comprising dynamic random access memory (DRAM) is stacked over the third die.

EXAMPLE 10

The apparatus of example 1, wherein a heat sink is coupled to the second die.

EXAMPLE 11

A method comprising: forming a substrate; forming a first die on the substrate, wherein forming the first die comprises a ferroelectric random access memory (FeRAM) having bit-cells, wherein each bit-cell comprises an access transistor and a capacitor including ferroelectric material, wherein the access transistor is coupled to the ferroelectric material; and forming a second die stacked over the first die, wherein forming the second die comprises forming a computational logic coupled to the memory of the first die.

EXAMPLE 12

The method of example 11, wherein forming the computational logic includes forming an array of multiplier cells, and wherein the FeRAM includes an array of memory bit-cells.

EXAMPLE 13

The method of example 12 comprising: forming an interconnect fiber; and coupling the interconnect fiber to the array of multiplier cells such that each multiplier cell is coupled to the interconnect fiber.

EXAMPLE 14

The method of example 11, wherein the FeRAM is partitioned into a first partition operable as buffers; and a second partition to store weight factors.

EXAMPLE 15

The method of example 14 comprises: receiving data by the computational logic from the first partition and the second partition; and providing an output of the computational logic to a logic circuitry.

EXAMPLE 16

The method of example 14, wherein forming the computational logic comprises forming ferroelectric logic, wherein the computational logic is operable to multiply at least two matrices.

EXAMPLE 17

The method of example 11, wherein forming the substrate comprises forming active or passive devices.

EXAMPLE 18

The method of example 11 comprises: forming a third die; coupling the third die on the substrate; forming a fourth die comprising dynamic random access memory (DRAM); and stacking the fourth die over the third die.

EXAMPLE 19

The method of example 11, comprising coupling a heat sink to the second die.

EXAMPLE 20

A system comprising: a first memory comprising non-volatile memory cells; a second memory comprising dynamic random access memory (DRAM), wherein the first memory is coupled to the second memory; a third memory comprising ferroelectric random access memory (FeRAM), wherein the third memory is coupled to the first memory; a first processor coupled to the second memory; and a second processor coupled to the third memory and the first processor, wherein the second processor comprises: a substrate; a first die on the substrate, wherein the first die comprises a ferroelectric random access memory (FeRAM) having bit-cells, wherein each bit-cell comprises an access transistor and a capacitor including ferroelectric material, wherein the access transistor is coupled to the ferroelectric material; and a second die stacked over the first die, wherein the second die comprises a multiplier coupled to the memory of the first die.

EXAMPLE 21

The system of example 20, wherein the multiplier includes an array of multiplier cells, and wherein the FeRAM includes an array of memory bit-cells, wherein each multiplier cell is coupled to corresponding memory bit-cell.

EXAMPLE 22

The system of example 21, wherein the second processor comprises an interconnect fiber coupled to the array of multiplier cells such that each multiplier cell is coupled to the interconnect fiber.

EXAMPLE 23

An apparatus comprising: an interposer; a first die on the interposer, wherein the first die comprises a random access memory (RAM) having bit-cells; and a second die stacked over the first die, wherein the second die comprises a matrix multiplier coupled to the memory of the first die.

EXAMPLE 24

The apparatus of example 23, wherein the matrix multiplier includes an array of multiplier cells, and wherein the RAM includes an array of memory bit-cells, and wherein each multiplier cell is coupled to corresponding memory bit-cell.

EXAMPLE 25

The apparatus of example 23, wherein the second die comprises a logic circuitry coupled to the matrix multiplier.

EXAMPLE 26

The apparatus of example 25, wherein the second die comprises a buffer coupled to the logic circuitry, and wherein the buffer is coupled to the memory.

EXAMPLE 27

The apparatus of example 23, wherein the memory comprises a ferroelectric random access memory (FeRAM) having bit-cells, wherein each bit-cell comprises an access transistor and a capacitor including ferroelectric material, wherein the access transistor is coupled to the ferroelectric material.

EXAMPLE 28

The apparatus of example 23, wherein the memory comprises a static random access memory (SRAM) having bit-cells.

EXAMPLE 29

The apparatus of example 23, wherein a heat sink is coupled to the second die.

EXAMPLE 30

The apparatus of example 23, wherein the interposer comprises memory coupled to the second die.

EXAMPLE 31

An apparatus comprising: an interposer; a first die on the interposer, wherein the first die comprises a random access memory (RAM) having bit-cells with ferroelectric material; a second die next to the first die and on the interposer, wherein the second die comprises a computational logic electrically coupled to the memory of the first die; and a third die on the interposer, wherein the third die comprises RAM having bit-cells, wherein the third die is next to the second die.

EXAMPLE 32

The apparatus of example 31, wherein the interposer comprises a RAM electrically coupled to the second die.

EXAMPLE 33

The apparatus of example 31, wherein the RAM of the third die comprises ferroelectric material.

EXAMPLE 34

The apparatus of example 31, wherein the computational logic includes a matrix multiplier which includes an array of multiplier cells.

EXAMPLE 35

The apparatus of example 34, wherein the second die comprises a logic circuitry coupled to the matrix multiplier.

EXAMPLE 36

The apparatus of example 35, wherein the second die comprises a buffer coupled to the logic circuitry, and wherein the buffer is coupled to the first or second dies.

EXAMPLE 37

The apparatus of example 31, wherein the at least one bit-cell of the first die comprises an access transistor and a capacitor including the ferroelectric material, wherein the access transistor is coupled to the ferroelectric material.

EXAMPLE 38

The apparatus of example 31, wherein the RAM of the third die comprises a static random access memory (SRAM) having bit-cells.

EXAMPLE 39

The apparatus of example 31, comprises a heat sink coupled to the first, second, and third dies.

EXAMPLE 40

A method comprising: forming an interposer; forming a first die on the interposer, wherein forming the first die comprises forming a random access memory (RAM) having bit-cells with ferroelectric material; forming a second die next to the first die and on the interposer, wherein forming the second die comprises: forming a computational logic; and electrically coupling to the memory of the first die with the computational logic; forming a third die on the interposer, wherein forming the third die comprises forming RAM having bit-cells; and positioning the third die next to the second die.

EXAMPLE 41

The method of example 40, wherein forming the interposer comprises forming a RAM inside the interposer; wherein the method comprises electrically coupling the RAM to the second die.

EXAMPLE 42

The method of example 40, wherein the RAM of the third die comprises ferroelectric material.

EXAMPLE 43

The method of example 40, wherein forming the computational logic includes forming a matrix multiplier, which includes an array of multiplier cells.

EXAMPLE 44

The method of example 43, wherein forming the second die comprises forming a logic circuitry; and wherein the method comprises coupling the logic circuitry to the matrix multiplier.

EXAMPLE 45

The method of example 44, wherein forming the second die comprises forming a buffer; and coupling the buffer to the logic circuitry, and wherein method comprises coupling the buffer to the first or second dies.

EXAMPLE 46

The method of example 40, wherein the at least one bit-cell of the first die comprises an access transistor and a capacitor including the ferroelectric material, and wherein the access transistor is coupled to the ferroelectric material.

EXAMPLE 47

The method of example 40, wherein forming the RAM of the third die comprises forming a static random access memory (SRAM) having bit-cells.

EXAMPLE 48

The method of example 40, comprises coupling a heat sink to the first, second, and third dies.

EXAMPLE 49

A system comprising: a first memory comprising non-volatile memory cells; a second memory comprising dynamic random access memory (DRAM), wherein the first memory is coupled to the second memory; a third memory comprising ferroelectric random access memory (FeRAM), wherein the third memory is coupled to the first memory; a first processor coupled to the second memory; and a second processor coupled to the third memory and the first processor, wherein the second processor comprises: an interposer; a first die on the interposer, wherein the first die comprises a random access memory (RAM) having bit-cells with ferroelectric material; a second die next to the first die and on the interposer, wherein the second die comprises a computational logic electrically coupled to the memory of the first die; and a third die on the interposer, wherein the third die comprises RAM having bit-cells, wherein the third die is next to the second die.

EXAMPLE 50

The system of example 49, wherein the interposer comprises a RAM electrically coupled to the second die, and wherein the RAM of the third die comprises ferroelectric material.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
a substrate having a top surface;
a first die directly on the top surface of the substrate through bumps or vias, wherein the first die comprises a ferroelectric random-access memory (FeRAM) having bit-cells, wherein each bit-cell comprises an access transistor and a capacitor including ferroelectric material, wherein the access transistor is coupled to the ferroelectric material; and
a second die vertically stacked over the first die, wherein the second die comprises a computational logic including an array of multiplier cells, wherein the computational logic is coupled to the FeRAM of the first die.

2. The apparatus of claim 1, wherein the FeRAM includes an array of memory bit-cells.

3. The apparatus of claim 2 comprising an interconnect fiber coupled to the array of multiplier cells such that each multiplier cell is coupled to the interconnect fiber.

4. The apparatus of claim 1, wherein the FeRAM is partitioned into a first partition operable as buffers; and a second partition to store weight factors.

5. The apparatus of claim 4, wherein the computational logic is to receive data from the first partition and the second partition, and wherein an output of the computational logic is received by logic circuitry.

6. The apparatus of claim 4, wherein the computational logic comprises ferroelectric logic.

7. The apparatus of claim 4 wherein the computational logic is operable to multiply at least two matrices.

8. The apparatus of claim 1, wherein the substrate comprises active or passive devices.

9. The apparatus of claim 1, wherein a third die is coupled on the substrate, and wherein a fourth die comprising dynamic random-access memory (DRAM) is stacked over the third die.

10. The apparatus of claim 1, wherein a heat sink is coupled to the second die.

11. A system comprising:
a first memory comprising non-volatile memory cells;
a second memory comprising dynamic random-access memory (DRAM), wherein the first memory is coupled to the second memory;
a third memory comprising ferroelectric random-access memory (FeRAM), wherein the third memory is coupled to the first memory;
a first processor coupled to the second memory; and
a second processor coupled to the third memory and the first processor, wherein the second processor comprises:
a substrate having a top surface;
a first die directly coupled to the top surface of the substrate through bumps or vias, wherein the first die comprises a ferroelectric random-access memory (FeRAM) having bit-cells, wherein each bit-cell comprises an access transistor and a capacitor including ferroelectric material, wherein the access transistor is coupled to the ferroelectric material; and
a second die vertically stacked over the first die, wherein the second die comprises a multiplier coupled to the FeRAM of the first die.

12. The system of claim 11, wherein the multiplier includes an array of multiplier cells, wherein the FeRAM includes an array of memory bit-cells, and wherein each multiplier cell is coupled to corresponding memory bit-cell.

13. The system of claim 12, wherein the second processor comprises an interconnect fiber coupled to the array of multiplier cells such that each multiplier cell is coupled to the interconnect fiber.

14. A system comprising:
a first memory comprising non-volatile memory cells;
a second memory comprising dynamic random-access memory (DRAM), wherein the first memory is coupled to the second memory;
a third memory comprising ferroelectric random-access memory (FeRAM), wherein the third memory is coupled to the first memory;
a first processor coupled to the second memory; and
a second processor coupled to the third memory and the first processor, wherein the second processor comprises:
an interposer having a top surface;
a first die directly on the top surface of the interposer through bumps or vias, wherein the first die comprises a random-access-memory (RAM) having bit-cells; and
a second die stacked vertically over the first die, wherein the second die comprises a matrix multiplier coupled to the RAM of the first die.

15. The system of claim 14, wherein the matrix multiplier includes an array of multiplier cells, wherein the RAM includes an array of memory bit-cells, and wherein each multiplier cell is coupled to corresponding memory bit-cell.

16. The system of claim 14, wherein the second die comprises a logic circuitry coupled to the matrix multiplier.

17. The system of claim 16, wherein the second die comprises a buffer coupled to the logic circuitry, and wherein the buffer is coupled to the RAM.

18. The system of claim 14, wherein the first die comprises a ferroelectric random-access memory (FeRAM) having bit-cells, wherein each bit-cell comprises an access transistor and a capacitor including ferroelectric material, and wherein the access transistor is coupled to the ferroelectric material.

19. The system of claim 14, wherein the RAM comprises a static random-access memory (SRAM) having bit-cells.

20. The system of claim 14, wherein a heat sink is coupled to the second die.

21. The system of claim 14, wherein the interposer comprises memory coupled to the second die.

22. The system of claim 14, wherein the interposer comprises active or passive devices.

* * * * *